(12) United States Patent
Kabbani et al.

(10) Patent No.: US 11,846,669 B2
(45) Date of Patent: *Dec. 19, 2023

(54) ACTIVE THERMAL INTERPOSER DEVICE

(71) Applicant: Advantest Test Solutions, Inc., San Jose, CA (US)

(72) Inventors: Samer Kabbani, Laguna Niguel, CA (US); Paul Ferrari, Mission Viejo, CA (US); Ikeda Hiroki, Kukishi Saitama (JP); Kiyokawa Toshiyuki, Kukishi Saitama (JP); Gregory Cruzan, Anaheim, CA (US); Karthik Ranganathan, Foothill Ranch, CA (US); Todd Berk, Rancho Santa Margarita, CA (US); Ian Williams, Huntington Beach, CA (US); Mohammad Ghazvini, Laguna Niguel, CA (US); Thomas Jones, San Jose, CA (US)

(73) Assignee: Advantest Test Solutions, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/841,471

(22) Filed: Jun. 15, 2022

(65) Prior Publication Data
US 2023/0129112 A1 Apr. 27, 2023

Related U.S. Application Data

(63) Continuation of application No. 17/531,638, filed on Nov. 19, 2021, now Pat. No. 11,609,266.
(Continued)

(51) Int. Cl.
*G01R 31/28* (2006.01)
*G01R 1/04* (2006.01)

(52) U.S. Cl.
CPC ....... *G01R 31/2875* (2013.01); *G01R 1/0458* (2013.01); *G01R 31/2863* (2013.01); *G01R 31/2867* (2013.01); *G01R 31/2874* (2013.01)

(58) Field of Classification Search
CPC ... G01R 31/286; G01R 31/2875; G01R 31/70
See application file for complete search history.

(56) References Cited

U.S. PATENT DOCUMENTS 5,126,656 A 6/1992 Jones
5,164,661 A 11/1992 Jones
(Continued)

FOREIGN PATENT DOCUMENTS

CN 101073016 A 11/2007
CN 103038751 A 4/2013
(Continued)

OTHER PUBLICATIONS

Ranganathan et al. D517: Shielded Socket and Carrier for High-Volume Test of Semiconductor Devices; Powerpoint; 12 pp. Sep. 30, 2021.

*Primary Examiner* — Tung X Nguyen

(57) ABSTRACT

A stand-alone active thermal interposer device for use in testing a system-in-package device under test (DUT), the active thermal interposer device includes a body layer having a first surface and a second surface, wherein the first surface is operable to be disposed adjacent to a cold plate, and a plurality of heating zones defined across a second surface of the body layer, the plurality of heating zones operable to be controlled by a thermal controller to selectively heat and maintain respective temperatures thereof, the plurality of heating zones operable to heat a plurality of areas of the DUT when the second surface of the body layer is disposed adjacent to an interface surface of the DUT during testing of the DUT.

29 Claims, 11 Drawing Sheets

Related U.S. Application Data

(60) Provisional application No. 63/121,532, filed on Dec. 4, 2020.

(56) References Cited

U.S. PATENT DOCUMENTS

| | | |
|---|---|---|
| 5,239,093 A | 8/1993 | Cheng |
| 5,315,240 A | 5/1994 | Jones |
| 5,329,093 A | 7/1994 | Okano |
| 5,420,521 A | 5/1995 | Jones |
| 5,821,505 A | 10/1998 | Tustaniwskyj et al. |
| 6,184,504 B1 | 2/2001 | Cardella |
| 6,359,264 B1 | 3/2002 | Schaper et al. |
| 6,389,225 B1 | 5/2002 | Malinoski et al. |
| 6,498,899 B2 | 12/2002 | Malinoski et al. |
| 6,515,470 B2 | 2/2003 | Suzuki et al. |
| 6,668,570 B2 | 12/2003 | Wall et al. |
| 6,711,904 B1 | 3/2004 | Law et al. |
| 6,825,681 B2 | 11/2004 | Feder et al. |
| 6,862,405 B2 | 3/2005 | Malinoski et al. |
| 6,985,000 B2 | 1/2006 | Feder et al. |
| 7,042,240 B2 | 5/2006 | Lopez et al. |
| 7,138,811 B1 | 11/2006 | Mahoney et al. |
| 7,151,388 B2 | 12/2006 | Gopal et al. |
| 7,311,782 B2 | 12/2007 | Strang et al. |
| 7,355,428 B2 | 4/2008 | Kabbani et al. |
| 7,411,792 B2 | 8/2008 | Richards et al. |
| 7,436,059 B1 | 10/2008 | Ouyang |
| 7,519,880 B1 | 4/2009 | Johnson et al. |
| 7,626,407 B2 | 12/2009 | Kabbani |
| 7,659,738 B2 | 2/2010 | Hong |
| 7,726,145 B2 | 6/2010 | Nakamura |
| 7,755,899 B2 | 7/2010 | Stenmark |
| 7,781,883 B2 | 8/2010 | Sri-Jayantha et al. |
| 7,830,164 B2 | 11/2010 | Earle et al. |
| 7,848,106 B2 | 12/2010 | Merrow |
| 8,343,280 B2 | 1/2013 | Iimuro |
| 8,558,540 B2 | 10/2013 | Wu et al. |
| 8,653,843 B2 | 2/2014 | Ando et al. |
| 8,772,682 B2 | 7/2014 | Ambal et al. |
| 8,927,907 B2 | 1/2015 | Fink et al. |
| 8,970,244 B2 | 3/2015 | Di Stefano et al. |
| 9,080,820 B3 | 7/2015 | Bolton |
| 9,291,667 B2 | 3/2016 | Armstrong et al. |
| 9,307,578 B2 | 4/2016 | Pease |
| 9,310,145 B2 | 4/2016 | Colongo et al. |
| 9,414,526 B2 | 8/2016 | Mann et al. |
| 9,494,353 B2 | 11/2016 | Yu et al. |
| 9,594,113 B2 | 3/2017 | Davis et al. |
| 9,766,287 B2 | 9/2017 | Narasaki et al. |
| 9,841,772 B2 | 12/2017 | Bucher |
| 10,056,225 B2 | 8/2018 | Gaff et al. |
| 10,126,356 B2 | 11/2018 | Barabi et al. |
| 10,163,668 B2 | 12/2018 | Steinhauser |
| 10,354,785 B2 | 7/2019 | Yamaguchi et al. |
| 10,656,200 B2 | 5/2020 | Cruzan et al. |
| 10,775,408 B2 | 9/2020 | Carvalho et al. |
| 10,908,207 B2 | 2/2021 | Barabi et al. |
| 10,955,466 B2 | 3/2021 | Tsai et al. |
| 10,983,145 B2 | 4/2021 | Akers et al. |
| 11,143,697 B2 | 10/2021 | Wolff |
| 2002/0026258 A1 | 2/2002 | Suzuki et al. |
| 2002/0118032 A1 | 8/2002 | Norris et al. |
| 2003/0155939 A1 | 8/2003 | Lutz et al. |
| 2004/0017185 A1 | 1/2004 | Song et al. |
| 2005/0026476 A1 | 2/2005 | Mok et al. |
| 2005/0086948 A1* | 4/2005 | Milke-Rojo ............ F25B 21/04 62/3.2 |
| 2005/0103034 A1 | 5/2005 | Hamilton et al. |
| 2005/0151553 A1 | 7/2005 | Kabbani et al. |
| 2006/0158207 A1 | 7/2006 | Reitinger |
| 2006/0290370 A1 | 12/2006 | Lopez |
| 2009/0160472 A1 | 6/2009 | Segawa et al. |
| 2009/0218087 A1 | 9/2009 | Oshima |
| 2010/0042355 A1 | 2/2010 | Aube et al. |
| 2011/0050268 A1 | 3/2011 | Co et al. |
| 2011/0074080 A1 | 3/2011 | Di Stefano et al. |
| 2013/0181576 A1 | 7/2013 | Shiozawa et al. |
| 2013/0285686 A1* | 10/2013 | Malik ................ G01R 31/2875 324/750.05 |
| 2014/0035715 A1 | 2/2014 | Takahashi et al. |
| 2014/0251214 A1 | 9/2014 | Cuvalci et al. |
| 2015/0028912 A1 | 1/2015 | Cho et al. |
| 2015/0137842 A1 | 5/2015 | Murakami et al. |
| 2015/0226794 A1 | 8/2015 | Chen |
| 2016/0084880 A1 | 3/2016 | LoCicero et al. |
| 2016/0247552 A1 | 8/2016 | Km et al. |
| 2016/0351526 A1 | 12/2016 | Boyd et al. |
| 2017/0102409 A1 | 4/2017 | Sarhad et al. |
| 2018/0024188 A1 | 1/2018 | Cruzan et al. |
| 2018/0189159 A1 | 7/2018 | Carmichael et al. |
| 2018/0218926 A1 | 8/2018 | Stuckey et al. |
| 2019/0064254 A1 | 2/2019 | Bowyer et al. |
| 2019/0162777 A1 | 5/2019 | Chiang et al. |
| 2019/0271719 A1 | 9/2019 | Sterzbach |
| 2019/0310314 A1 | 10/2019 | Liu et al. |
| 2019/0346482 A1 | 11/2019 | Kiyokawa et al. |
| 2020/0041564 A1 | 2/2020 | Cojocneanu et al. |
| 2020/0363104 A1 | 11/2020 | MacDonald et al. |
| 2020/0371155 A1 | 11/2020 | Walczyk et al. |
| 2021/0071917 A1 | 3/2021 | Pei et al. |
| 2021/0183668 A1 | 6/2021 | Cagle et al. |
| 2021/0293495 A1 | 9/2021 | Barako et al. |
| 2021/0396801 A1 | 12/2021 | Ranganathan et al. |
| 2022/0044084 A1 | 2/2022 | Cardy |
| 2022/0082587 A1 | 3/2022 | Gopal et al. |
| 2022/0137092 A1 | 5/2022 | Ranganathan et al. |
| 2022/0137129 A1 | 5/2022 | Ranganathan et al. |
| 2022/0206061 A1 | 6/2022 | Ranganathan et al. |

FOREIGN PATENT DOCUMENTS

| | | |
|---|---|---|
| CN | 105144114 A | 12/2015 |
| CN | 109716513 A | 5/2019 |
| CN | 110214270 A | 9/2019 |
| CN | 110618903 A | 12/2019 |
| EP | 3270261 A1 | 1/2018 |
| JP | 2005156172 A1 | 6/2005 |
| JP | 2008275512 A | 11/2008 |
| TW | 446682 B | 7/2001 |
| TW | 200535440 A | 11/2005 |
| TW | 200620596 A | 6/2006 |
| TW | 200628818 A | 8/2006 |
| TW | 201226579 A | 7/2012 |
| TW | 201229535 A | 7/2012 |
| TW | 201323883 A | 6/2013 |
| TW | 201333497 A | 8/2013 |
| TW | 201447325 A | 12/2014 |
| TW | 201504647 A | 2/2015 |
| TW | 201608254 A | 3/2016 |
| TW | 201712459 A | 4/2017 |
| TW | 201834134 A | 9/2018 |
| TW | 201840996 A | 11/2018 |
| TW | i651540 B | 2/2019 |
| TW | 202004980 A | 1/2020 |
| TW | 202043787 A | 12/2020 |
| TW | 202043787 A | 12/2022 |
| WO | 2016122039 A1 | 8/2016 |
| WO | 201712076 A1 | 1/2017 |
| WO | 2017015052 A1 | 1/2017 |
| WO | 2017039936 A1 | 3/2017 |
| WO | 2020159954 A1 | 8/2020 |

\* cited by examiner

ACTIVE THERMAL INTERPOSER DEVICE

RELATED APPLICATION(S)

This Application is a continuation of U.S. patent application Ser. No. 17/531,638 now U.S. Pat. No. 11,609,266, filed Nov. 19, 2021, entitled "Active Thermal Interposer Device," which claims priority to U.S. Provisional Application No. 63/121,532, filed Dec. 4, 2020, entitled, "Active Thermal Interposer," both of which are also incorporated herein by reference in its entirety. This application is related to U.S. Pat. No. 9,291,667 entitled "Adaptive Thermal Control," which is incorporated herein by reference in its entirety. This application is related to U.S. patent application, filed Nov. 19, 2021, entitled "Active Thermal Interposer Device" to Kabbani et al., which is incorporated herein by reference in its entirety.

FIELD OF INVENTION

Embodiments of the present invention relate to the field of integrated circuit manufacturing and test. More specifically, embodiments of the present invention relate to systems and methods for active thermal interposer devices.

BACKGROUND

It is common to subject integrated circuits, either packaged or unpackaged, to environmental testing as an operation in a manufacturing processes. Typically in such testing, the integrated circuit devices are subject to electrical testing, e.g., "test patterns," to confirm functionality while being subjected to environmental stress. For example, an integrated circuit is heated and/or cooled to its specification limits while being electrically tested. In some cases, e.g., for qualification testing, an integrated circuit may be stressed beyond its specifications, for example, to determine failure points and/or establish "guard band" on its environmental specifications.

Traditionally, such testing has included placing one or more integrated circuits and their associated test interface(s) and support hardware into an environmental chamber. The environmental chamber would heat and/or cool the integrated circuit(s) under test, known as or referred to as a device under test, or "DUT," as well as the test interface and support hardware, to the desired test temperature. Unfortunately, use of such test chambers has numerous drawbacks. For example, the limits and/or accuracy of such testing may be degraded due to environmental limits of the test interface circuits and/or devices. In addition, due to the large volumes of air and mass of mounting structures and interface devices required within an environmental test chamber, the environment inside such a test chamber may not be changed rapidly, limiting a rate of testing. Further, placing and removing DUTs and testing apparatus into and out of such test chambers further limits rates of testing, and requires complex and expensive mechanisms to perform such insertions and removals.

SUMMARY OF THE INVENTION

Therefore, what is needed are systems and methods for active thermal interposer devices. What is additionally needed are systems and methods for active thermal interposer devices operable to control different portions of a device under test to different temperatures. Further, there is a need for systems and methods for active thermal interposer devices operable to control different portions of a device under test at different heights to different temperatures. There is a still further need for systems and methods for active thermal interposer devices that are compatible and complementary with existing systems and methods of testing integrated circuits.

In accordance with embodiments of the present invention, a stand-alone active thermal interposer device for use in testing a system-in-package device under test (DUT), the active thermal interposer device includes a body layer having a first surface and a second surface, wherein the first surface is operable to be disposed adjacent to a cold plate, and a plurality of heating zones are defined across the second surface of the body layer, the plurality of heating zones are operable to be controlled by a thermal controller to selectively heat and maintain respective temperatures thereof, the plurality of heating zones operable to heat a plurality of areas of the DUT when the second surface of the body layer is disposed adjacent to an interface surface of the DUT during testing of the DUT.

Embodiments include the above and further includes each heating zone of the plurality of heating zones includes resistive traces for providing heat responsive to a voltage/current signal applied thereto as controlled by the thermal controller.

Embodiments include the above and further include the body layer further includes a plurality of pogo pin mechanical/electrical interfaces for mating with corresponding pogo pins of a thermal array. The plurality of pogo pin mechanical/electrical interfaces are operable to input voltage/current signals from the thermal array for supply to the plurality of heater zones and also operable to output temperature sensor data corresponding to the plurality of heater zones.

Embodiments include the above and further include a grounded shield layer disposed on top of the second surface of the body layer and on top of the plurality of heating zones, the grounded shield layer operable to isolate the DUT from electro-magnetic interference radiation resultant from energizing heating zones of the plurality of heating zones.

Embodiments include the above and further include a two-dimensional identification code viewable thereon and wherein the two-dimensional identification code is operable to be machine read and provides one of: calibration values for a resistance temperature detector of the active thermal interposer device, identification information for identifying the active thermal interposer device, and security information for authenticating the active thermal interposer device.

Embodiments include the above and further include the body layer further includes alignment features disposed on the first surface, the alignment features for providing alignment between power pins of the active thermal interposer device and pads of a thermal head of the tester system, and wherein the thermal head includes the cold plate.

Embodiments include the above and further include wherein the alignment features include micro-alignment bushings.

Embodiments include the above and further include a plurality of mechanical buttons for providing mechanical compliance between the interface surface of the DUT and the plurality of heater zones. Each mechanical button is disposed between the body layer and a respective heater zone of the plurality of heater zones. Further, each mechanical button includes an array of spring loaded pogo pins.

Embodiments include the above and further include a kick-off mechanical button disposed on the second surface of the body layer, the kick-off mechanical button including an array of spring loaded pogo pins and operable to separate the interface surface of the DUT from the second surface of the body layer when a force applied there between is removed.

Embodiments include the above and further include the DUT includes a multi-chip module and wherein further the plurality of heating and/or cooling zones are operable to be selectively energized for selectively heating and maintaining temperatures of chips of the multi-chip module during the testing of the DUT.

Embodiments include the above and further include a Peltier/TEC cooling layer disposed on the first surface of the body layer.

Embodiments include the above and further include wherein the body layer further includes a plurality of pogo pin mechanical interfaces, the plurality of pogo pin mechanical interfaces operable to input voltage/current signals for supply to the plurality of heater zones and also operable to output temperature sensor data corresponding to the plurality of heater zones and also operable to input signals to control the Peltier/TEC cooling layer.

In accordance with a method embodiment, a method of testing a system-in-package device under test (DUT) using an automated handler system and a tester system includes using a handler, automatically picking up the DUT from a tray and automatically placing the DUT into a socket, using an optical sensor to determine if the DUT is aligned planar with respect to its orientation within the socket, using the handler, automatically picking up an active thermal interposer device and automatically placing the active thermal interposer device on top of the DUT within the socket wherein the automatically placing the active thermal interposer device includes using alignment features of the active thermal interposer device and of the socket to align the active thermal interposer device, and using the optical sensor to determine if the active thermal interposer device is aligned planar regarding its orientation within the socket and with respect to the DUT.

Embodiments include the above and further include wherein the automatically picking up the DUT from a tray and automatically placing the DUT into a socket is performed by a first pick-and-place head of the handler and wherein further the automatically picking up an active thermal interposer device and automatically placing the active thermal interposer device onto top of the DUT within the socket is performed by a second pick-and-place head of the handler.

Embodiments include the above and further include wherein the automatically picking up an active thermal interposer device and automatically placing the active thermal interposer device onto top of the DUT within the socket further includes using an optical reader to read a two dimensional identification code disposed on the active thermal interposer device wherein the two dimensional identification code provides information including one of: an identification of the active thermal interposer device, thermal calibration data regarding the active thermal interposer device, and authentication information regarding the active thermal interposer device and further including relaying the information to the tester system.

In accordance with another method embodiment, a method of testing a system-in-package device under test (DUT) using an automated handler system and a tester system, the method includes using a first pick-and-place head of the handler, automatically picking up the DUT from a tray and automatically placing the DUT into a socket, and using a second pick-and-place head of the handler, automatically picking up an active thermal interposer device and automatically placing the active thermal interposer device onto top of the DUT within the socket wherein the automatically placing the active thermal interposer device includes aligning the active thermal interposer device using alignment features of the active thermal interposer device and of the socket.

Embodiments include the above and further include wherein the automatically picking up an active thermal interposer device and automatically placing the active thermal interposer device onto top of the DUT within the socket further includes using an optical reader to read a two dimensional identification code disposed on the active thermal interposer device wherein the two dimensional identification code provides information including one of: an identification of the active thermal interposer device, thermal calibration data regarding the active thermal interposer device, and authentication information regarding the active thermal interposer device and further including relaying the information to the tester system.

In accordance with a method embodiment, a method of testing a system-in-package device under test (DUT) using an automated handler system and a tester system, the method including using the handler, automatically picking up the DUT from a tray and automatically placing the DUT into a socket, using the handler, automatically picking up an active thermal interposer device and automatically placing the active thermal interposer device on top of the DUT within the socket, wherein the automatically placing the active thermal interposer device includes aligning the active thermal interposer device by using alignment features of the active thermal interposer device and of the socket, wherein the active thermal interposer device, the DUT and the socket each have a respective two dimensional code disposed thereon for identification, authorization and/or calibration purposes, and using an optical reader to read the two dimensional codes disposed on the active thermal interposer device, the DUT and the socket.

In accordance with another method embodiment, a method of testing a system-in-package device under test (DUT) using an automated handler system and a tester system, the method including using the handler, automatically picking up the DUT from a tray and automatically placing the DUT into a socket, wherein the DUT is secured within the socket via first retention features disposed within the socket, using the handler, automatically picking up an active thermal interposer device and automatically placing the active thermal interposer device on top of the DUT within the socket, wherein the active thermal interposer device is secured within the socket via second retention features disposed within the socket and wherein further if the active thermal interposer device is placed within the socket by the handler and the DUT is not within the socket, then the retention features are operable to prevent the active thermal interposer device from contacting pins of the socket.

In accordance with embodiments of the present invention, a testing device for testing a system-in-package device under test (DUT) includes a stand-alone active thermal interposer device for use in testing the DUT and for coupling with a thermal controller, the active thermal interposer device including a body layer having a first surface and a second surface, wherein the first surface is operable to be disposed adjacent to a cold plate, and a plurality of heating zones defined across a second surface of the body layer, the plurality of heating zones operable to be controlled by a thermal controller to selectively heat and maintain respective temperatures thereof, the plurality of heating zones operable to heat a plurality of areas of the DUT when the second surface of the body layer is disposed adjacent to an interface surface of the DUT during testing of the DUT, and a thermal head for coupling to the thermal controller and operable to interface with the active thermal interposer device during testing of the DUT, the thermal head including: the cold plate, and an insulation cover for insulating the cold plate, wherein the insulation cover includes a compressed dry air (CDA) injection port for reducing condensation from the cold plate.

Embodiments include the above and further include a thermal interface material layer disposed between the active thermal interposer device and the cold plate for coupling thermal energy from the active thermal interposer device to the cold plate.

Embodiments include the above and further include wherein the thermal interface material layer comprises a plurality of cutouts configured to prevent a pick and place handler from adhering to the thermal interface material layer.

In accordance with embodiments of the present invention, a testing arrangement for testing a system-in-package device under test (DUT), the arrangement including: a socket device for containing the DUT and for interfacing with a load board, stand-alone active thermal interposer device for use in testing the DUT, the active thermal interposer device including: a body layer having a first surface and a second surface, wherein the first surface is operable to be disposed adjacent to a cold plate, and a plurality of heating zones defined across a second surface of the body layer, the plurality of heating zones operable to be controlled to selectively heat and maintain respective temperatures thereof, the plurality of heating zones operable to heat a plurality of areas of the DUT when the active thermal interposer device is inserted into the socket and the second surface of the body layer is disposed adjacent to an interface surface of the DUT, a thermal head operable to interface with the active thermal interposer device during testing of the DUT, the thermal head including the cold plate, and a thermal controller for coupling with the active thermal interposer device to control the plurality of heating zones and to control the cold plate, the thermal controller including firmware operable to perform thermal regulation during testing of the DUT, the firmware operable to: obtain first temperatures which are of the cold plate from a temperature sensor of the cold plate, obtain second temperatures of the bottom surface of the active thermal interposer device for each heating zone thereof using respective resistance temperature detectors, obtain third temperatures of each area of the DUT provided the DUT is active and circuitry on the load board is operable to collect a junction temperature for each area of the DUT, based on the first temperatures, perform an outer slower loop to regulate a fan speed (for air control) or a fluid regulation valve (for liquid/refrigerant control) of the cold plate, and based on the second and third temperatures, perform an inner faster loop to regulate heater control/Peltier control of the plurality of heating zones of the active thermal interposer device.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

DETAILED DESCRIPTION

Figure 1A:
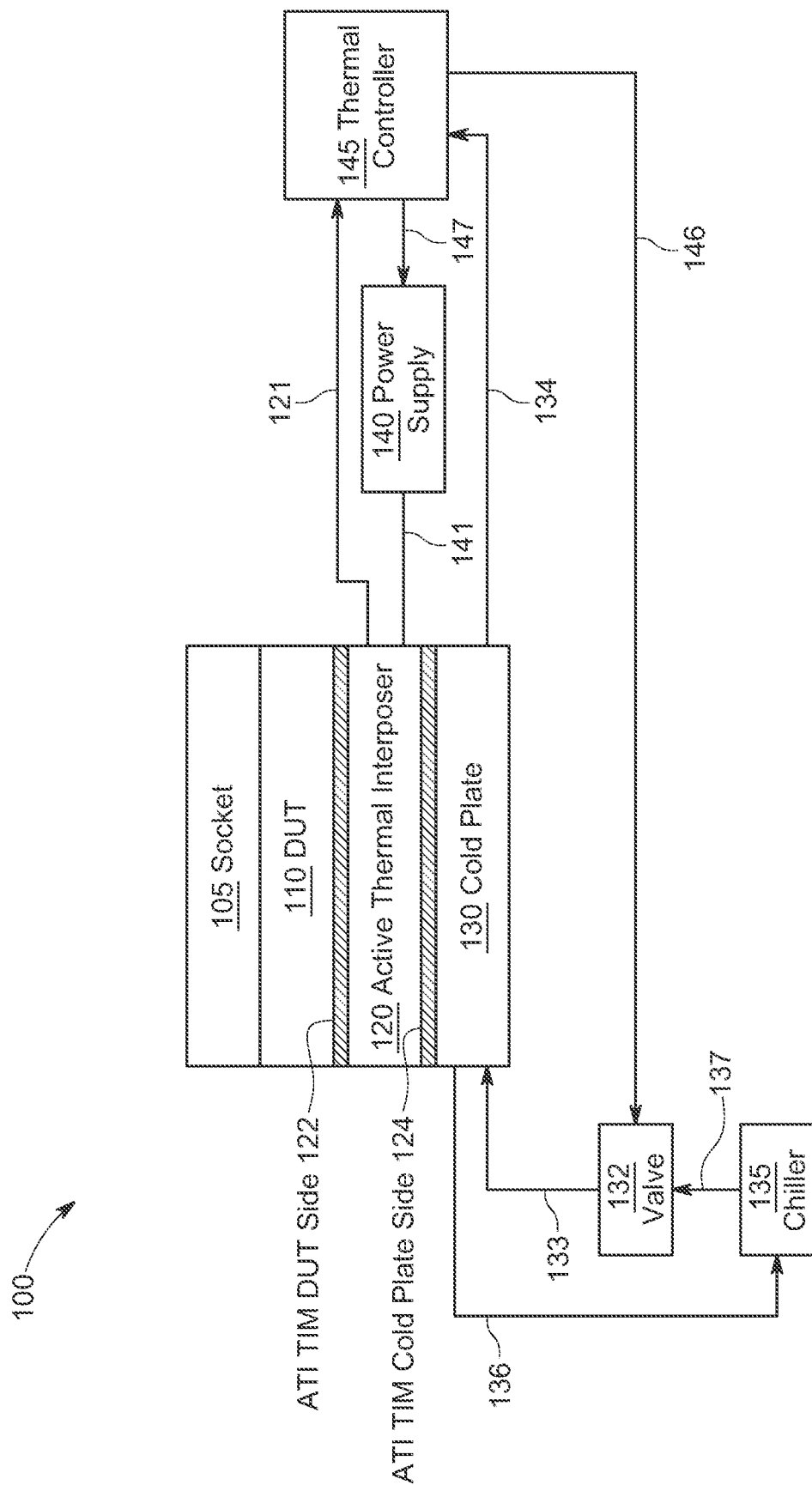
FIG. 1A illustrates an exemplary block diagram of elements of an automated test system environment that may serve as a platform for embodiments in accordance with the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions which follow (e.g., method 600) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "testing" or "heating" or "maintaining temperature" or "bringing" or "capturing" or "storing" or "reading" or "analyzing" or "generating" or "resolving" or "accepting" or "selecting" or "determining" or "displaying" or "presenting" or "computing" or "sending" or "receiving" or "reducing" or "detecting" or "setting" or "accessing" or "placing" or "testing" or "forming" or "mounting" or "removing" or "ceasing" or "stopping" or "coating" or "processing" or "performing" or "generating" or "adjusting" or "creating" or "executing" or "continuing" or "indexing" or "translating" or "calculating" or "measuring" or "gathering" or "running" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The meaning of "non-transitory computer-readable medium" should be construed to exclude only those types of transitory computer-readable media which were found to fall outside the scope of patentable subject matter under 35 U.S.C. § 101 in In re Nuijten, 500 F.3d 1346, 1356-57 (Fed. Cir. 2007). The use of this term is to be understood to remove only propagating transitory signals per se from the claim scope and does not relinquish rights to all standard computer-readable media that are not only propagating transitory signals per se.

Active Thermal Interposer Device

FIG. 1A illustrates an exemplary block diagram of elements of an automated test system environment 100 that may serve as a platform for embodiments in accordance with the present invention. Test system 100 comprises a device under test (DUT) 110, for example, an integrated circuit device, a system in a package (SIP), and/or a multi-chip module (MCM). The device under test is typically packaged, but that is not required. A socket 105 is coupled to device under test 110, e.g., utilizing package leads on the DUT 110, to send and receive test signals and power to device under test 110. Socket 105 is typically coupled to, and tests, a single device under test 110 at a time, although that is not required. Socket 105 may be mounted to, or coupled to, a load board (not shown) for electrically coupling the socket 105 to a test controller, e.g., for electrical testing of DUT 110.

In accordance with embodiments of the present invention, a novel active thermal interposer device 120 is coupled to the backside or top of device under test 110. Active thermal interposer device 120 may be customized for a specific design of device under test 110, in some embodiments. In some embodiments, there may be a thermal interface material 122 between active thermal interposer device 120 and device under test 110. Such a thermal interface material, if present, is designed to improve thermal coupling between active thermal interposer device 120 and device under test 110.

In some embodiments, active thermal interposer device 120 may comprise a base layer of aluminum nitride (AlN) with tungsten and/or molybdenum traces. A high temperature co-fired ceramic (HTCC) process may be utilized. Such embodiments may be suitable for testing comparatively higher power devices. In some embodiments, a low temperature co-fired ceramic (LTCC) process, e.g., comprising aluminum oxide ($Al_2O_3$) may be utilized. Such embodiments may be suitable for testing comparatively lower power devices.

Active thermal interposer device 120 is further coupled to a cold plate 130. In some embodiments, there may be a thermal interface material 124 between active thermal interposer device 120 and cold plate 130. Such a thermal interface material, if present, is designed to improve thermal coupling between active thermal interposer device 120 and cold plate 130.

In an embodiment, a cooling fluid, e.g., comprising glycol, although other fluids, including air, may be used, is generally circulated through cold plate 130. To adjust the temperature of the cold plate 130, the temperature of the cooling fluid may be adjusted, in some embodiments. In some embodiments, as illustrated in FIG. 1A, the flow rate of the cooling fluid may also be adjusted, e.g., increased, reduced, started, and/or stopped. For example, a speed of a pump and/or fan may be adjusted. In an embodiment, chiller 135 cools the cooling fluid, e.g., to −60 degrees C. The cooling fluid flows 137 to valve 132. Valve 132, under the control of thermal controller 145 via control signal 146, regulates the flow 133 of cooling fluid to cold plate 130, based on one or more temperature measurements 134. After cycling through cold plate 130, the cooling fluid is returned 136 to the chiller 135. Cold plate 130 may also be air or gas cooled, in some embodiments. In this manner, thermal controller 145 may cool DUT 110 during testing via cooling action from chiller 135 and the cold plate 130.

In accordance with embodiments of the present invention, thermal controller 145 may implement some or all of the control processes described in U.S. Pat. No. 9,291,667 entitled "Adaptive Thermal Control," incorporated herein by reference in its entirety.

In some embodiments, cold plate 130 may comprise an evaporator and/or phase change cooling system. In such embodiments, chiller 135 may comprise a compressor and/or radiator, for example.

Active thermal interposer device 120 functions to apply heat energy to one or more temperature regions of device under test 110. For example, each die of a multi-chip module device under test may be individually temperature controlled. To accomplish such heating, active thermal interposer device 120 comprises one or more heating elements, as further described below. The heating elements of active thermal interposer device 120 define the temperature regions of device under test 110. In some embodiments, the heating elements may comprise resistive traces on a ceramic substrate. In some embodiments, the heating elements may comprise a cartridge heater. In some embodiments, the heating elements may comprise cooling elements, e.g., Peltier devices or other forms of thermoelectric coolers (TEC), capable of cooling as well. However, any suitable heating and/or cooling technology, in any combination, is well suited to embodiments in accordance with the present invention. Active thermal interposer device 120 also functions to couple heat energy from device under test 110 to cold plate 130 and/or to cooling elements within active thermal interposer device 120, in some embodiments.

Active thermal interposer device 120 further comprises one or more temperature measurement devices, e.g., resistance temperature detectors and/or thermocouples. The one or more temperature measurement devices are configured to measure a temperature of a region of device under test 110. The one or more temperature measurement devices may be located within or in close proximity to the heating elements of active thermal interposer device 120. In some embodiments, active thermal interposer device 120 may comprise temperature measurement devices characterized as not within or in close proximity to the heating elements of active thermal interposer device 120. In some embodiments, a load board may comprise temperature measurement devices. Each of the one or more temperature measurement devices sends a temperature signal 121 to thermal controller 145. Socket 105, device under test 110, active thermal interposer device 120, and cold plate 130 may be collectively known as or referred to as a test stack when coupled together as illustrated in FIG. 1A.

Test system 100 further comprises a thermal controller 145. Thermal controller 145 sends control signals 1477 to power supply 140 to supply electrical power 141 to one or more heating elements of active thermal interposer device 120. Each heating element of active thermal interposer device 120 may be individually controlled. Accordingly, there are typically more power signals 141 than illustrated. There may be more than one power supply, in some embodiments. Based on temperature signal 121 from one or more of the plurality of temperature measurement devices, thermal controller may control power supply 140 to change the power supplied to a heating element. Power supply 140 may change a voltage level and/or pulse width modulate a voltage supplied to a heating element, in some embodiments. Thermal controller 145 also controls the amount of heat energy extracted 136 from cold plate 130. For example, thermal controller 145 controls the temperature of cold plate 130. Thermal controller 145 controls value 132 based on temperature signal 121.

It is to be appreciated that cold plate 130 extracts heat, through active thermal interposer device 120, from substantially all of device under test 110. In addition, cold plate 130 typically has a large thermal mass, and does not change temperature quickly. Accordingly, heating elements of active thermal interposer device 120 may often be required to overcome the cooling effect of cold plate 130, during DUT testing, for example. In some embodiments, different regions of a device under test 110 may be heated and/or cooled to different temperatures. For example, one region of device under test 110 may be heated to 100 degrees C., e.g., via a heater within active thermal interposer device 120, while another region of device under test 110 may be allowed to cool toward the temperature of cold plate 130 with no heat applied to such region by active thermal interposer device 120. Such differential heating and/or cooling of different regions of device under test 110 may produce a thermal gradient across or between regions of device under test 110, in some embodiments.

It is appreciated that active thermal interposer device 120 is a separate device from cold plate device 130 and socket device 105. Active thermal interposer device 120 is typically customized for a particular device under test and/or socket combination, but that is not required. In this novel manner, since the active thermal interposer device is a stand alone device, different active thermal interposer devices may be utilized with standard cold plates and/or a variety of sockets in various combination to test a variety of devices. For example, a functionally similar multi-chip module may have multiple versions with similar or identical pin layouts but a different physical arrangement of chips. Testing of such a family could be performed with the same socket with different active thermal interposer devices to account for a different physical arrangement of chips.

Figure 1B:
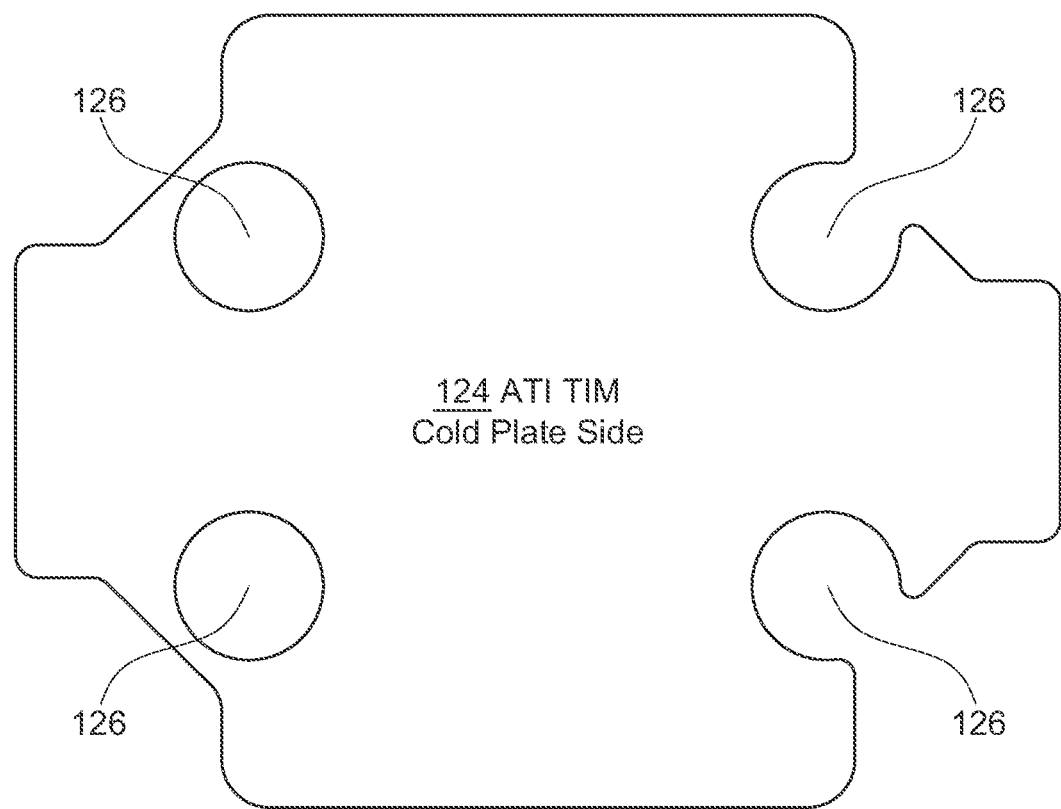
FIG. 1B illustrates a plan view of an exemplary cold plate side active thermal interposer thermal interface material, in accordance with embodiments of the present invention.

FIG. 1B illustrates a plan view of an exemplary cold plate side active thermal interposer thermal interface material 124, in accordance with embodiments of the present invention. Thermal interface material 124 is designed to improve thermal coupling between active thermal interposer device 120 and cold plate 130, and may typically be adhered to active thermal interposer 120 (FIG. 1A), in some embodiments. Thermal interface material 124 may comprise indium foil coupled to an adhesive sheet, in some embodiments. In some embodiments, thermal interface material 124 comprises a plurality of cutouts 126. The cutout(s) match the contact location(s) of pick and place vacuum suction heads, in some embodiments. The cutout(s) may provide clearance for such pick and place vacuum suction heads in order to prevent a pick and place handler from adhering to the thermal interface material 124, e.g., when attempting to handle an active thermal interposer, e.g., active thermal interposer 120.

Figure 1C:
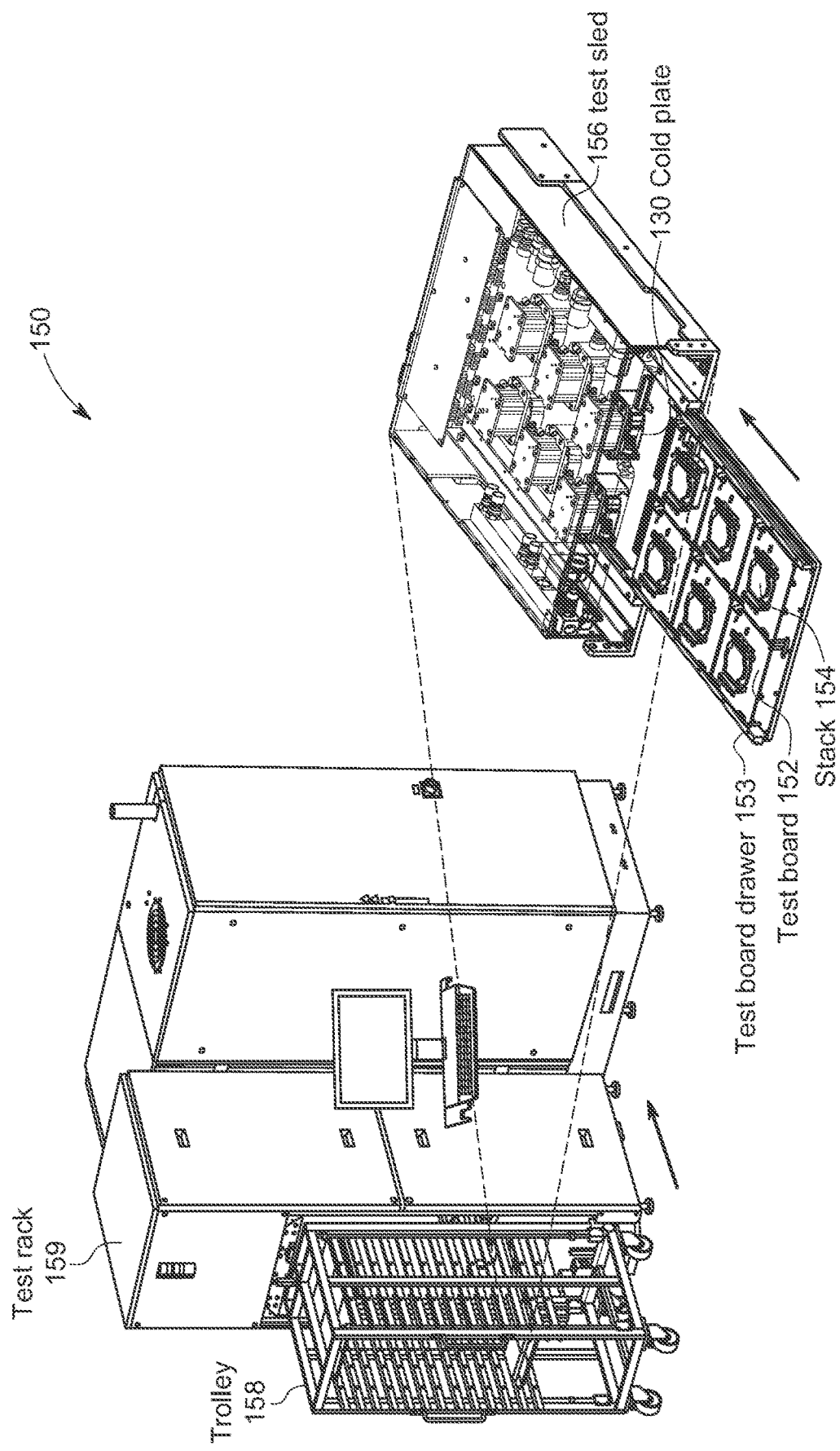
FIG. 1C illustrates a perspective view of an exemplary test system, in accordance with embodiments of the present invention.

FIG. 1C illustrates a perspective view of an exemplary test system 150, in accordance with embodiments of the present invention. Test system 150 comprises a plurality of test sleds, for example, exemplary test sled 156. Test sled 156 comprises a plurality, e.g., six, cold plates 130. Test sled 156 is configured to accept a test board drawer 153, which may be inserted into the main body of test sled 156. Test board drawer 153 comprises a test board 152. Test board 152 comprises a plurality, e.g., six, of stacks 154. Each of stacks 154 comprises a socket 105, a device under test 110 and an active thermal interposer device 120. Stack 154 may also include thermal interface materials 122 and/or 124, in some embodiments. Test sled 156 further comprises power distribution, and couplings to power, electrical test signals, and cooling fluids. Test sled 156 is configured to couple the plurality of cold plates to the stacks 154 when test board drawer 153 is inserted into the test sled 156. It is appreciated that the perspective of a test stack as illustrated in FIG. 1C is reversed with respect to the test stack as illustrated in FIG. 1A. For example, the cold plate 130 is on the top in FIG. 1C, while the cold plate 130 is illustrated on the bottom in FIG. 1A.

A plurality of test sleds 156, e.g., 12, is configured to be placed in trolley 158, for insertion into a test rack 159. When inserted into test rack 159, the necessary electrical power, test signals, and cooling are supplied to each test stack comprising a cold plate 130, an active thermal interposer device 120, a device under test 110 and a socket 105 to be asynchronously tested by test system 150. In this novel manner, up to, for example, 72, devices may be heated and/or cooled, and electrically tested at the same time in a single test system 150.

Figure 1D:
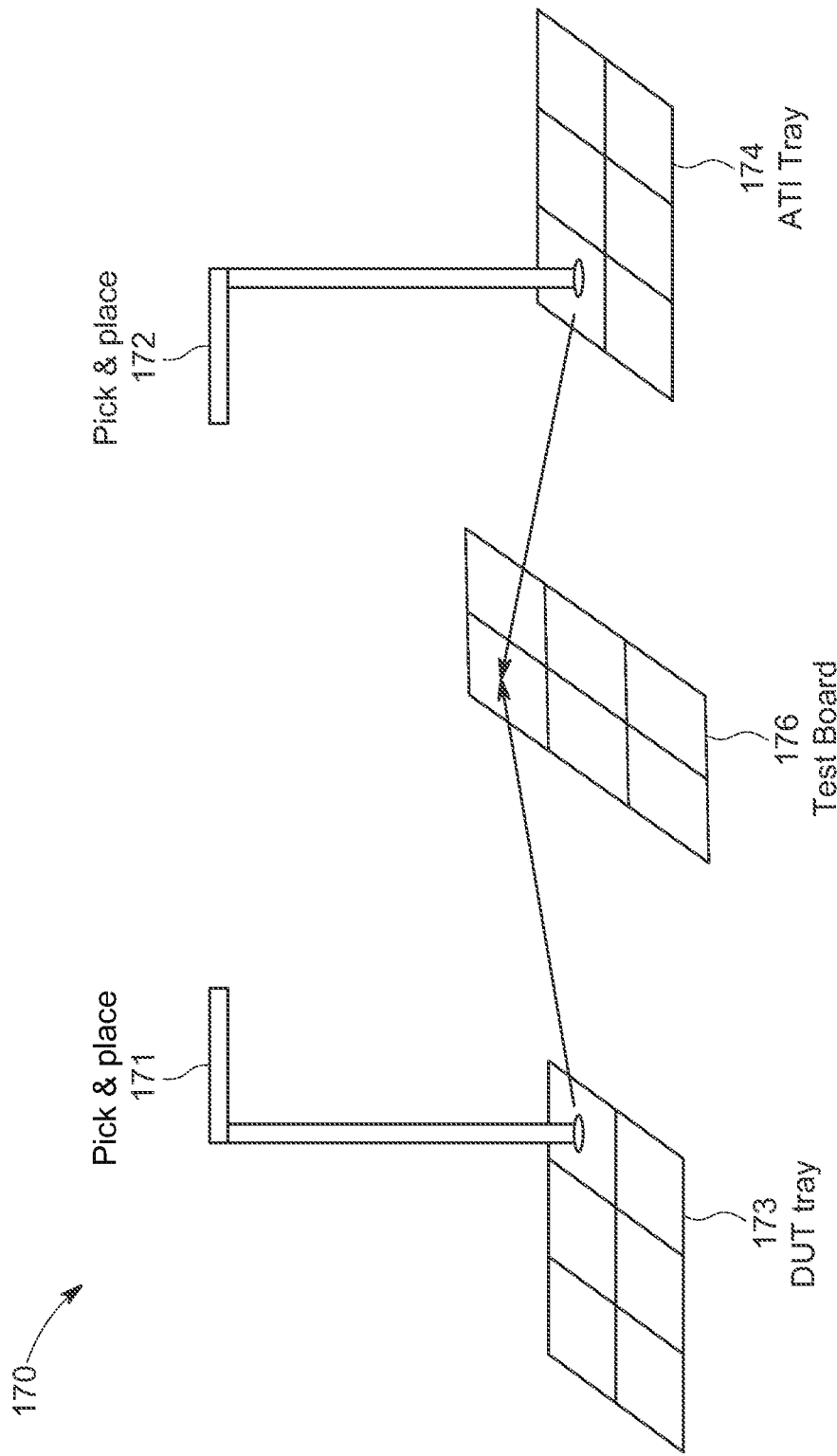
FIG. 1D illustrates an exemplary testing system including the robotic mechanisms for automatically picking and placing a DUT into the socket and also for picking an active thermal interposer device and placing it into the socket with the DUT, in accordance with embodiments of the present invention.

FIG. 1D illustrates an exemplary testing system 170 including the robotic mechanisms for automatically picking and placing a DUT into the socket and also for picking an active thermal interposer device and placing it into the socket with the DUT, in accordance with embodiments of the present invention. After placement into the socket, the DUT and the active thermal interposer device are passed to a thermal head. For example, the thermal head comprises a cold plate, e.g., cold plate 130. In one embodiment, the thermal head contains 12 slots; each slot containing 6 sockets, therefore 72 DUTs with corresponding active thermal interposer devices can be tested simultaneously. After testing, the active thermal interposer devices may be reused to test other DUTs. Within the thermal head is contained the cold plates which come into contact with the active thermal interposer device during testing.

Within embodiments of the present invention, the active thermal interposer device is known as or referred to as a "stand alone" device because it is not permanently attached to any other device within the testing system, as with the prior art testing systems and environments. In other words, the active thermal interposer device, being custom designed for the DUT, is actively picked and placed, as a stand alone part, and inserted into the socket as described above. Therefore, in order to redesign the testing system for use with another type of DUT, only the active thermal interposer device, the DUT and the socket need to be redesigned, while the remainder of the testing system, including a cold plate, may be reused.

Regarding FIG. 1D, a first pick and place arm 171 retrieves a device under test, e.g., DUT 110 of FIG. 1A, from a tray of DUTs 173, and places it into a socket, e.g., socket 105 (FIG. 1A) on a test board 176. The test board 176 may correspond to test board 152 of FIG. 1C. A second pick and place arm 172 retrieves an active thermal interposer device, e.g., active thermal interposer device 120 of FIG. 1A, from a tray of active thermal interposer devices 174, and places the active thermal interposer device on top of the DUT, which is already on test board 176. The pick and place arms 171, 172 may grasp the DUT and/or active thermal interposer device via any suitable means, including, for example, by grasping on sides and/or above and below, and/or via vacuum suction, in some embodiments.

Figure 2:
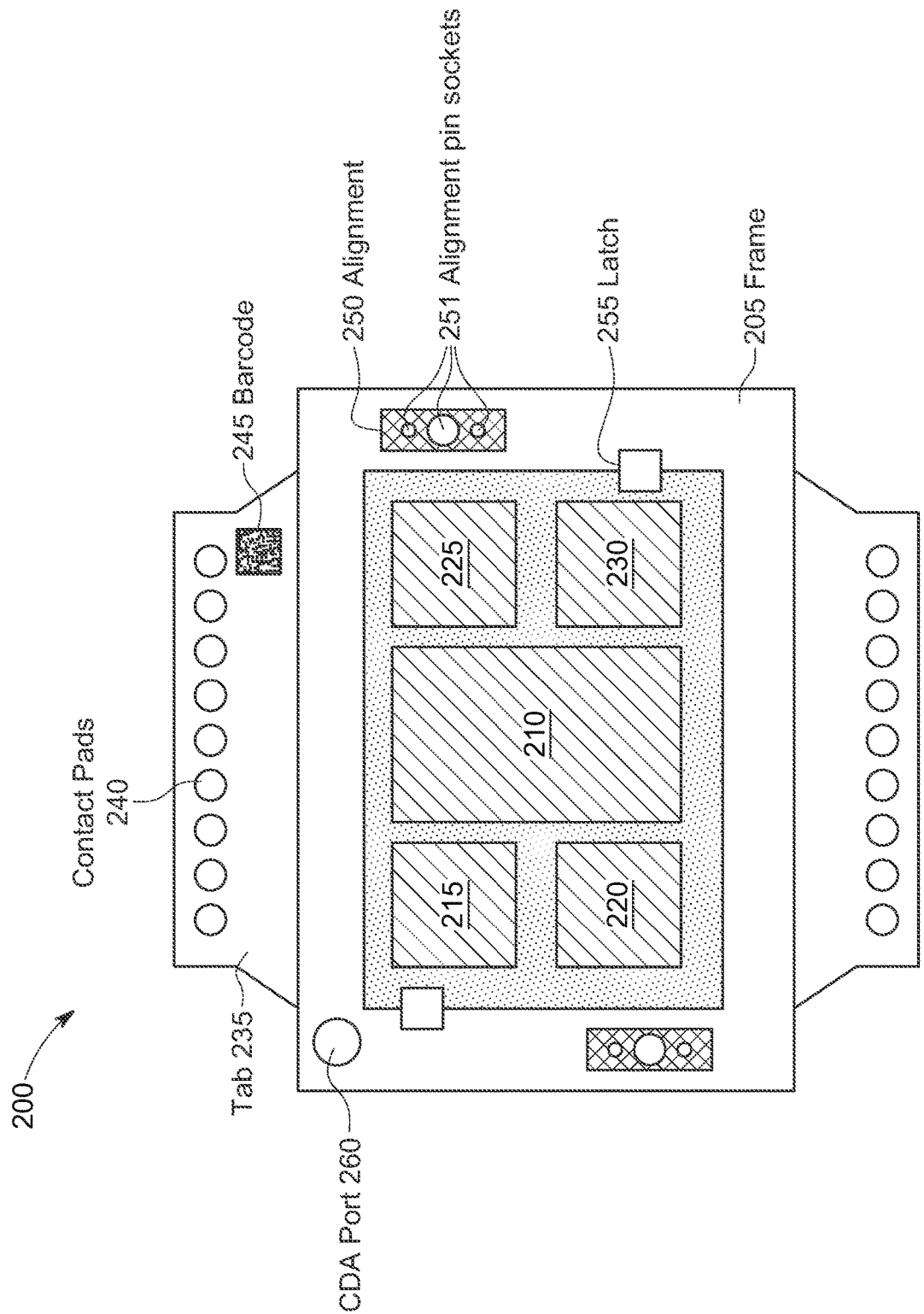
FIG. 2 illustrates an exemplary block diagram of a novel active thermal interposer device, in accordance with embodiments of the present invention.

FIG. 2 illustrates an exemplary block diagram of a novel active thermal interposer device 200, in accordance with embodiments of the present invention. Active thermal interposer device 200 comprises a frame 205 upon which other elements may be attached or mounted. Frame 205 may comprise any suitable materials, for example, thermoplastics. Frame 205 comprises tabs 235. Tabs 235 are configured for handling and/or manipulation of active thermal interposer device 200, for example, by automated grasping equipment and/or pick and place equipment. A plurality of contact pads 240 may be located on tabs 235 for making electrical contact to active thermal interposer device 200. For example, contact pads 240 may be configured to mechanically and electrically couple with pogo pins (not shown) to couple electrical power and/or thermal sensor signals to/from active thermal interposer device 200. In some embodiments, the contact pads 240 may comprise pads of different sizes and/or shapes, for example, to correspond to different current capacities. In accordance with embodiments of the present invention, the ambient atmosphere near any pogo pins should be kept above the dew point in order to minimize and/or reduce condensation, which may have a deleterious effect on contact reliability. In accordance with embodiments of the present invention, active thermal interposer device 200 may comprise one or more compressed dry air (CDA) ports 260, which may be coupled to a source of dry air, and utilized to inject dry air into the test stack in order to prevent condensation. Active thermal interposer device 200 may comprise an insulative cover (not shown) to help prevent condensation, in some embodiments.

Active thermal interposer device 200 may comprise latches 255, in some embodiments. Latches 255 are configured to securely couple a device under test (not shown) to the active thermal interposer device 200. For example, latches 255 may extend over a device under test and/or its socket, and lock it into place. Active thermal interposer device 200 may comprise alignment features 250, in some embodiments. Alignment features 250 may comprise fiducial alignment markings and/or receptacles, for example, micro-alignment bushings, e.g., alignment pin sockets 251, to assist and/or ensure alignment of active thermal interposer device 200 into a test stack, as described with respect to FIG. 1A.

In accordance with embodiments of the present invention, the socket, e.g., socket 105 of FIG. 1A, and/or active thermal interposer device 200 comprise features to prevent the active thermal interposer device 200 from making undesired electrical contact with electrical contacts of the socket if a device under test is not present. Such undesired contact may lead to detrimental voltages and/or currents from the active thermal interposer device 200 coupled into test equipment via the socket and/or physical damage to socket contacts. Locating contact pads 240 outside of a footprint of a DUT, e.g., outside of a socket, may help to prevent such undesired contact, in some embodiments.

In some embodiments, active thermal interposer device 200 may comprise a barcode 245, e.g., for identification purposes. Barcode 245 may comprise any suitable encoding, including two-dimensional barcodes, in accordance with embodiments of the present invention. Barcode 245 may uniquely identify a particular active thermal interposer device 200, in some embodiments. Uniquely identifying a particular active thermal interposer device 200 may allow calibration information for the particular active thermal interposer device 200 to be retried from a database and utilized during testing with the particular active thermal interposer device 200, in some embodiments. In some embodiments, barcode 245 may be utilized to record and track which particular active thermal interposer device 200 is used for testing with a particular socket, e.g., socket 105 of FIG. 1A, and/or is used for testing a particular device under test, e.g., DUT 110 of FIG. 1A.

In some embodiments, barcode 245 may encode calibration parameters, e.g., for thermal sensors, corresponding to a particular active thermal interposer device 200. For example, such encoding may eliminate a need to access a database to retrieve such information. Barcode 245 may be utilized to ensure that a correct active thermal interposer device 200 is selected, installed, and/or used for a particular test. For example, barcode 245 may be utilized to authorize and/or authenticate a particular active thermal interposer device for use in particular equipment and/or for use in a particular test. Barcode 245 may be read when an active thermal interposer device is picked up for placement, e.g., from a storage location, and/or when placed in a test stack. In some embodiments, the information encoded on barcode 245 may be encrypted. For example, information may be encrypted and then encoded by a standard barcode encoding.

Active thermal interposer device 200 may comprise a plurality of active thermal regions or zones 210, 215, 220, 225, 230, in some embodiments. In some embodiments, there may be a single thermal region. Each thermal region may correspond to a region of a device under test. For example, active thermal region 210 may correspond to a large die of a multi-chip module, which active thermal regions 215, 220, 225, and 230 correspond to other and/or smaller chips of the multi-chip module. In some embodiments, multiple thermal regions may correspond to a single die or chip.

Each of active thermal regions 215, 220, 225, and 230 are configured to selectively apply thermal energy to a device under test, e.g., DUT 110 of FIG. 1A. The active thermal regions 215, 220, 225, and 230 are also configured to selectively extract thermal energy from a device under test. The extraction of thermal energy may be via a coupling to a cold plate, e.g., cold plate 130 of FIG. 1A, and/or via a Peltier device within the active thermal regions 215, 220, 225, and 230. Each active thermal region may be independently controlled to a different temperature.

Figure 3:
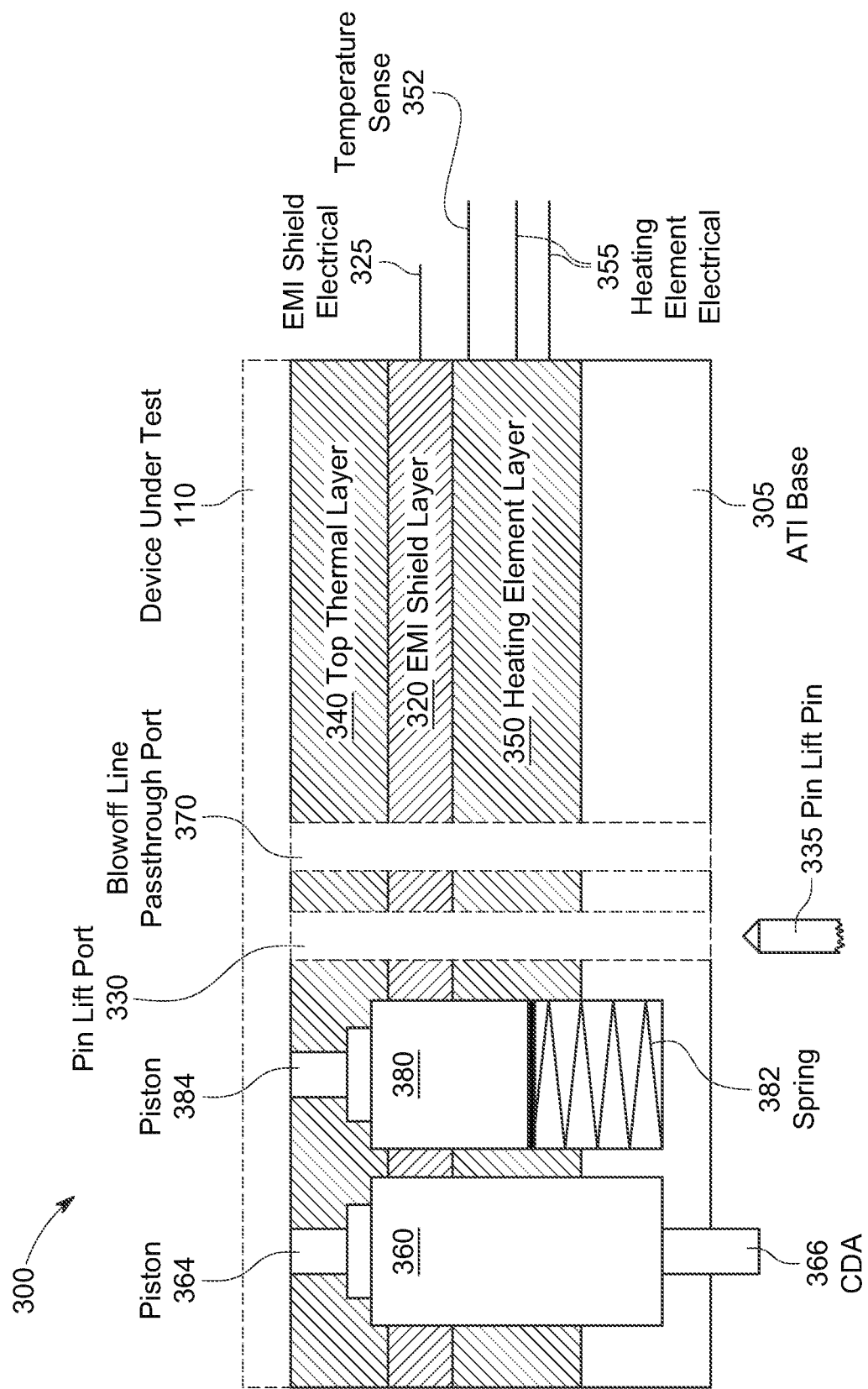
FIG. 3 illustrates an exemplary block diagram cross sectional view of a novel active thermal interposer device, in accordance with embodiments of the present invention.

FIG. 3 illustrates an exemplary block diagram cross sectional view of a novel active thermal interposer device 300, in accordance with embodiments of the present invention. In the embodiment of FIG. 3, a device under test 110 is illustrated at the top of the active thermal interposer device 300. Device under test 110 is included for illustration, and is not a part of active thermal interposer device 300. Active thermal interposer device 300 comprises a heating element layer 350, mounted to or on an active thermal interposer device base 305. Heating element layer 350 comprises a plurality of heating elements configured to apply heat energy to device under test 110. The heating elements may comprise resistive traces or other suitable types of heaters. Active thermal interposer device 300 may also comprise cooling elements, e.g., Peltier devices, within heating element layer 350, in some embodiments. The plurality of heating and/or cooling elements are coupled to a plurality of electrical signals 355, for providing controlled power to the heating and/or cooling elements. Heating element layer 350 may include low resistance traces, e.g., from electrical signals 355 to the actual heating elements, in some embodiments. Heating element layer 350 also comprises one or more temperature measurement devices, e.g., thermocouples, (not shown), which are coupled to control elements via temperature a plurality of sense signals 352.

In accordance with embodiments of the present invention, active thermal interposer device 300 may comprise a novel electromagnetic interference (EMI) shield layer 320. Each of the plurality of heating elements in layer 350 may utilize currents of many tens of amperes, e.g., to generate heating of hundreds of watts during testing of a DUT. In accordance with embodiments of the present invention that utilize switching such currents to control temperature, e.g., pulse width modulation, such switching may induce unwanted electromagnetic noise signals that are deleterious to the operation and/or test of integrated circuits, e.g., device under test 110 of FIG. 1A, coupled to the active thermal interposer device 300. In some embodiments, EMI shield layer 320 comprises a solid layer of conductor, e.g., conductive traces similar to those utilized in heating element layer 350. In some embodiments, EMI shield layer 320 comprises a grid of conductive elements. The grid may be sized to attenuate desired wavelength(s) of electromagnetic interference. EMI shield layer 320 may have an electrical connection 325, e.g., to ground, in some embodiments.

Figure 5:
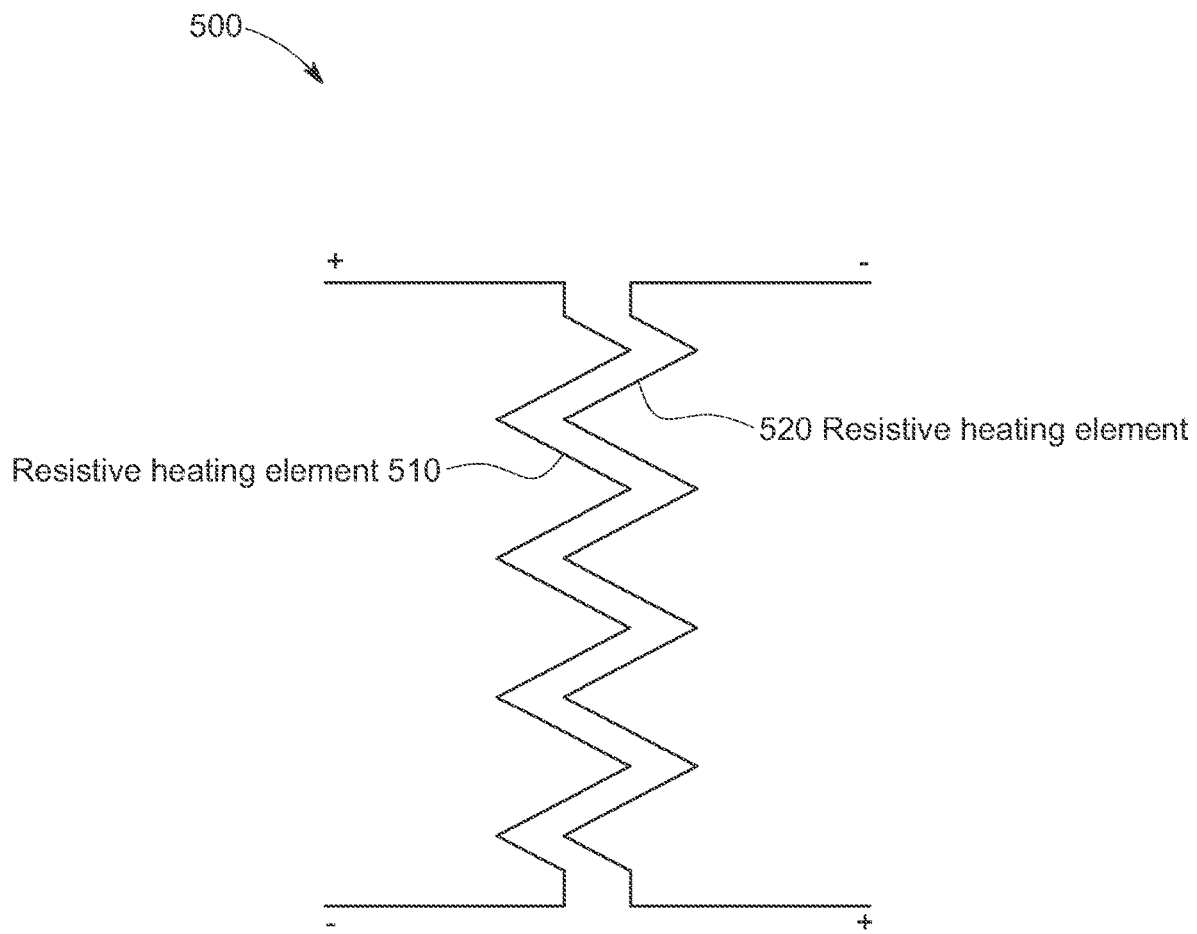
FIG. 5 illustrates a schematic of an exemplary heating element, in accordance with embodiments of the present invention.

Referring now to FIG. 5, FIG. 5 illustrates a schematic of an exemplary heating element 500, in accordance with embodiments of the present invention. Heating element 500 is well suited to use in active thermal interposer device 120 (FIG. 1A). Heating element 500 may be powered by a voltage/current drive signal, and comprises two resistive heating elements 510 and 520. Heating elements 510 and 520 may comprise resistive traces on a ceramic substrate, in some embodiments. Heating elements 510 and 520 comprise resistive traces in a generally serpentine pattern, although the straight traces illustrated are not required. The traces may have a substantially curved nature, in some embodiments. Heating elements 510 and 520 are close together, for example, as close as allowed by design rules for the technology, including current carrying capacity and insulative separation requirements. Heating elements 510 and 520 may be operated together while phase reversed. For example, in the illustration of FIG. 5, current may flow from top to bottom in heating element 510, and from bottom to top in heating element 520. In this novel arrangement, electromagnetic fields generated by switching of currents within heating element 510 may be substantially canceled by inverted electromagnetic fields generated by switching of currents within heating element 520, reducing deleterious electromagnetic interference. If elements of heating elements 510 and 520 comprise parallel elements, capacitive coupling may be beneficial as well, e.g., reducing inductance in the resistive heating elements.

Referring once again to FIG. 3, active thermal interposer device 300 comprises a top thermal layer 340. Thermal layer 340 functions to couple heat energy from heating element layer 350 to a device under test and vice versa. Thermal layer 340 is non conductive, in some embodiments. Thermal layer 340 should have a high degree of co-planarity in order to facilitate good thermal conduction to a device under test, in some embodiments.

Active thermal interposer device 300 should be compatible and complementary with conventional elements of integrated circuit test equipment. In some embodiments, active thermal interposer device 300 may comprise a blowoff line passthrough port 370. Blowoff line passthrough port 370 couples to a conventional blowoff line, as is typically used to break a seal or kick off a device under test, prior to removing the device under test from the test system. For example, blowoff line passthrough port 370 mates with a blowoff line port of a conventional cold plate, e.g., cold plate 130 of FIG. 1A. There may be a plurality of blowoff line passthrough ports 370 in an instance of active thermal interposer device 300, for example three arranged in an equilateral triangle, in some embodiments. A blowoff line passthrough port 370 typically extends through active thermal interposer device 300.

Active thermal interposer device 300 may also or alternatively comprise a device under test pin lift port 330, in some embodiments. Device under test pin lift port 330 may be aligned with a similar port or channel in a cold plate, e.g., cold plate 130 of FIG. 1A. Device under test pin lift port 330 enables a device under test lift pin 335 to raise a device under test above the top of the active thermal interposer device 300. The lift pin 335 typically extends from or through a cold plate, e.g., cold plate 130 of FIG. 1A, and/or from a chuck mechanism (not shown). In accordance with some embodiments of the present invention, the lift pin 335 may be lengthened, in contrast to a conventional lift pin, to account for the thickness of active thermal interposer device 300. There may be a plurality of pin lift ports 330 in an instance of active thermal interposer device 300, for example three arranged in an equilateral triangle, in some embodiments. A pin lift port 330 typically extends through active thermal interposer device 300.

Active thermal interposer device 300 may also or alternatively comprise a device under test air-powered kick off device 360. Kick off device 360 comprises a kick off piston 364 that selectively pushes against DUT 110 in response to pressure applied via compressed dry air (CDA) port 366. Active thermal interposer device 300 may also or alternatively comprise a device under test spring loaded kick off device 380. Device under test spring loaded kick off device 380 comprises a spring 382 that pushes piston 384 to push against DUT 110. A force exerted by spring 382 may be controlled, in some embodiments. For example, spring 382 may be constrained by a releasable latch mechanism, in some embodiments. In other embodiments, spring 382 may comprise memory wire, for example, which expands in response to an applied voltage. In some embodiments, spring 382 may not be controlled. For example, spring 382 may always apply a force against DUT 110. When, for example, a retention latch, e.g., latch 255 of FIG. 2, is released, spring 382 may act, forcing piston 384 against DUT 110, providing sufficient force to dislodge DUT 110 from active thermal interposer device 300.

Figure 4:
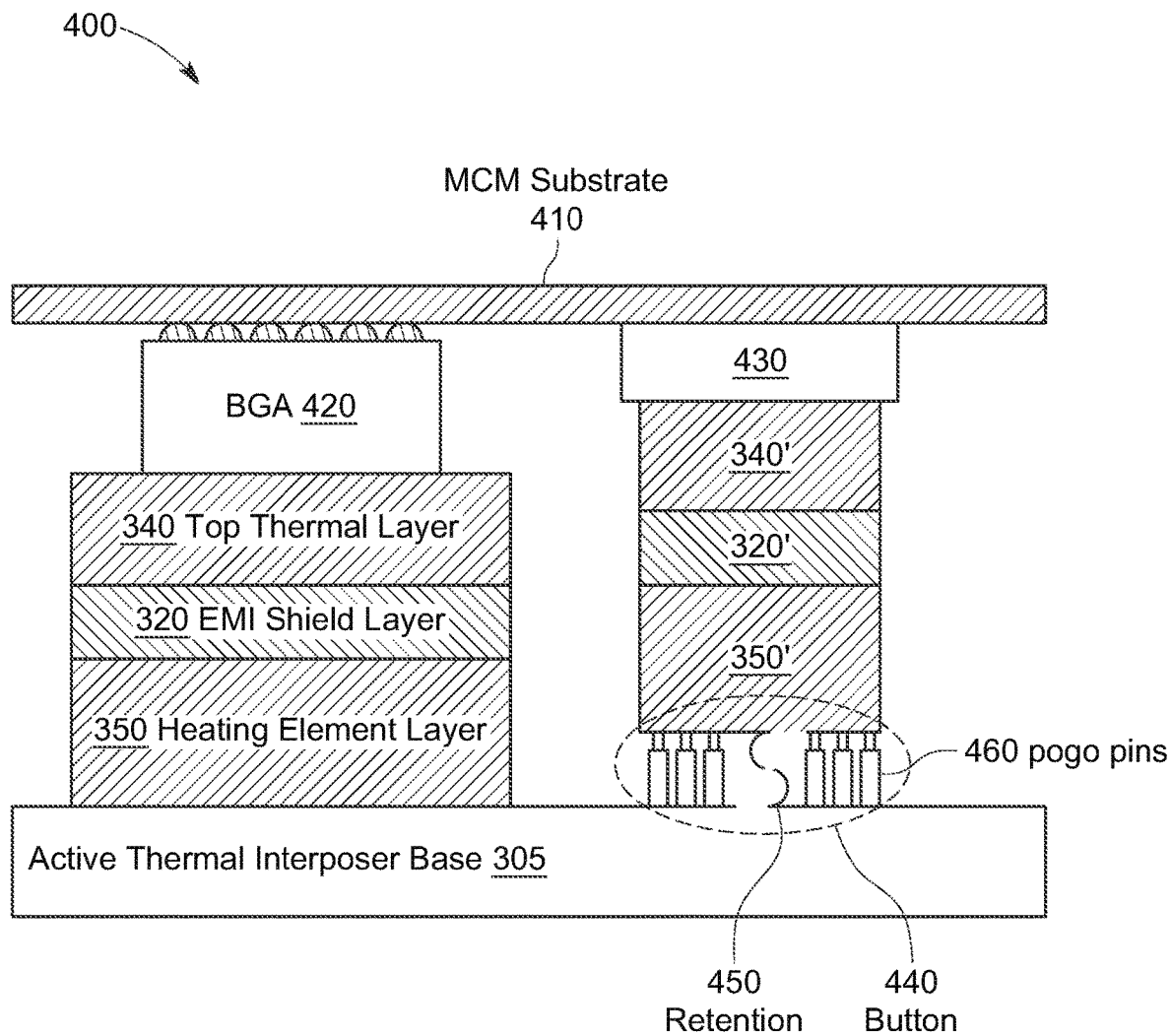
FIG. 4 illustrates an exemplary block diagram cross sectional view of a novel active thermal interposer device, in accordance with embodiments of the present invention.

It is appreciated that multi-chip modules often comprise integrated circuit devices of differing heights or thickness. FIG. 4 illustrates an exemplary block diagram cross sectional view of a novel active thermal interposer device 400, in accordance with embodiments of the present invention. Active thermal interposer device 400 is configured to mechanically and thermally couple to a multi-chip module comprising integrated circuit devices of differing heights or thickness. FIG. 4 illustrates a multi-chip module device under test comprising a substrate 410, for example a printed wiring board or a ceramic substrate, an integrated circuit packaged in a ball grid array (BGA) 420, and another integrated circuit 430 packaged in a lower profile package, e.g., a plastic-leaded chip carrier (PLCC) or a "glop top" conformal coating. Package 420 is the tallest structure of the multi-chip module. Elements 410, 420 and 430 are illustrated for context, and are not a part of active thermal interposer device 400.

Elements 305, 350, 320 and 340 are as previously described with respect to FIG. 3, and may be described as or referred to as a test stack and/or thermal stack. Elements 350, 320 and 340 may correspond to thermal region 210 of FIG. 2, for example. Elements 350', 320', and 340' have corresponding functions to elements 350, 320 and 340, and may be described as or referred to as a (different) thermal stack. Elements 350', 320', and 340' may correspond to thermal region 230 of FIG. 2, for example. In general, elements 350', 320', and 340' may be the same thickness as the corresponding elements 350, 320 and 340, but that is not required. In contrast to elements 350, 320 and 340, elements 350', 320', and 340' are mounted on top of button 440. Button 440 comprises a plurality of pogo pins 460 and optional retention mechanism 450. Button 440 is configured to raise (in the configuration of FIG. 4) elements 350', 320' and 340' so that top thermal layer 340' is in good thermal contact with integrated circuit package 430.

The plurality of pogo pins 460 push heating element layer 350', EMI shield layer 320' and top thermal layer 340' up so that top thermal layer 340' is in good thermal contact with integrated circuit package 430. The plurality of pogo pins 460 also couple electrical signals to heating element 350' and EMI shield layer 320'. Optional retention mechanism 450 may keep elements 350', 320', and 340' from rising too far, for example, when a DUT is removed. It is appreciated that heating element layer 350' may comprise contact pads to couple with pogo pins 460. Heating element layer 350 may comprise similar pads, or may utilize a different mechanism to make electrical coupling(s) with a test apparatus, in embodiments. In accordance with embodiments of the present invention, a single active thermal interposer device may comprise multiple thermal stacks on multiple buttons at different heights.

Figure 6:
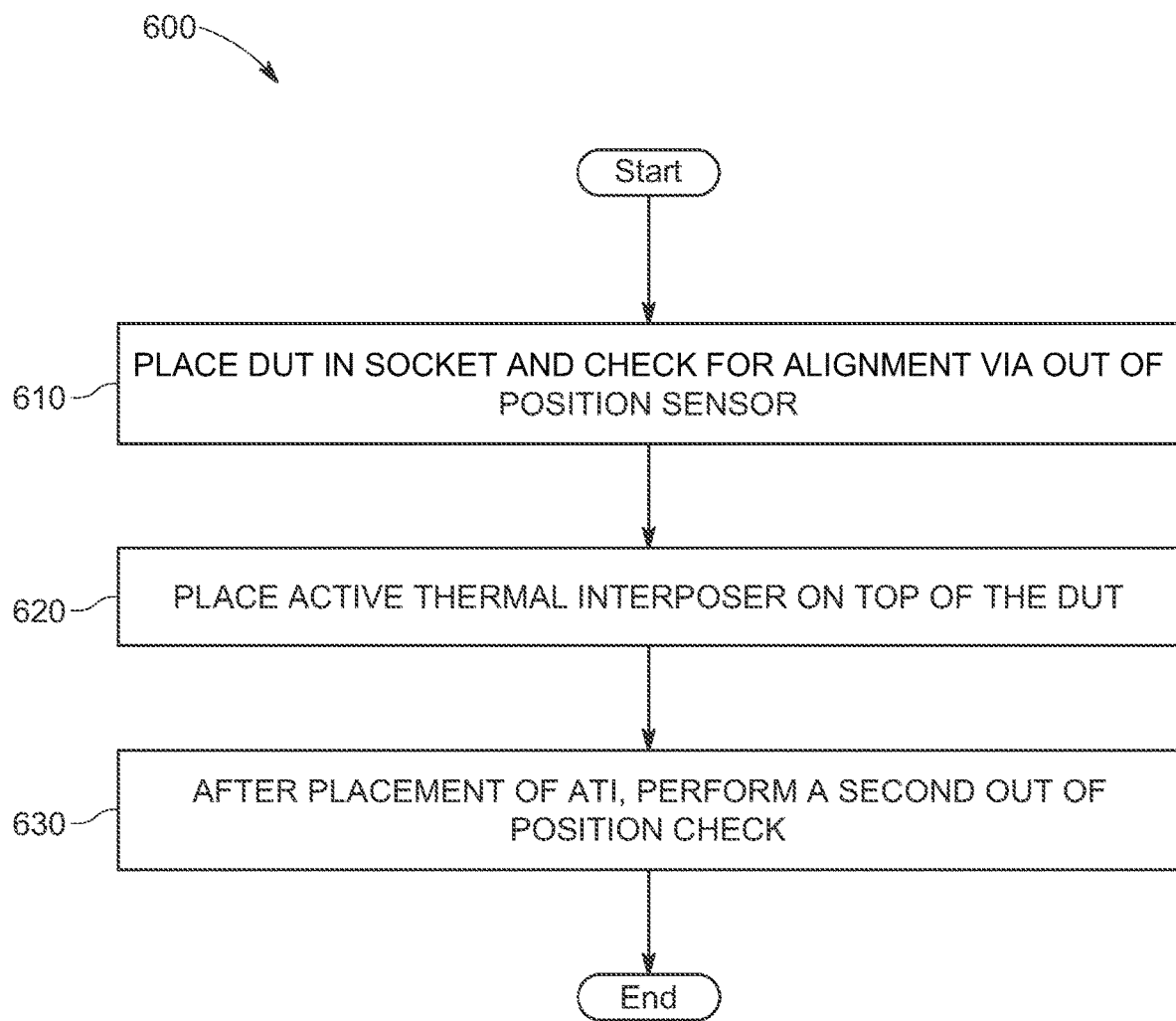
FIG. 6 illustrates an exemplary computer-controlled method for testing circuits of an integrated circuit semiconductor wafer, in accordance with embodiments of the present invention.

FIG. 6 illustrates an exemplary computer-controlled method 600 for testing circuits of an integrated circuit semiconductor wafer, in accordance with embodiments of the present invention. Method 600 may be practiced by test system 170 as described in FIG. 1D, in some embodiments. In 610, a handler device places a device under test, e.g., DUT 110 of FIG. 1A, into a socket, e.g., socket 105 of FIG. 1A, and checks if the DUT is aligned via an out of position (OOP) sensor. In 620, the handler places the active thermal interposer device, e.g., active thermal interposer device 120 of FIG. 1A, on top of the DUT. The alignment features in the socket and on the active thermal interposer device, e.g., 250 of FIG. 2, assist in placing the active thermal interposer device on top of the DUT. In 630, after the active thermal interposer device is placed, a second OOP check is performed to ensure that the active thermal interposer device is placed in a planar fashion and is not tilted or otherwise misaligned.

Figure 7:
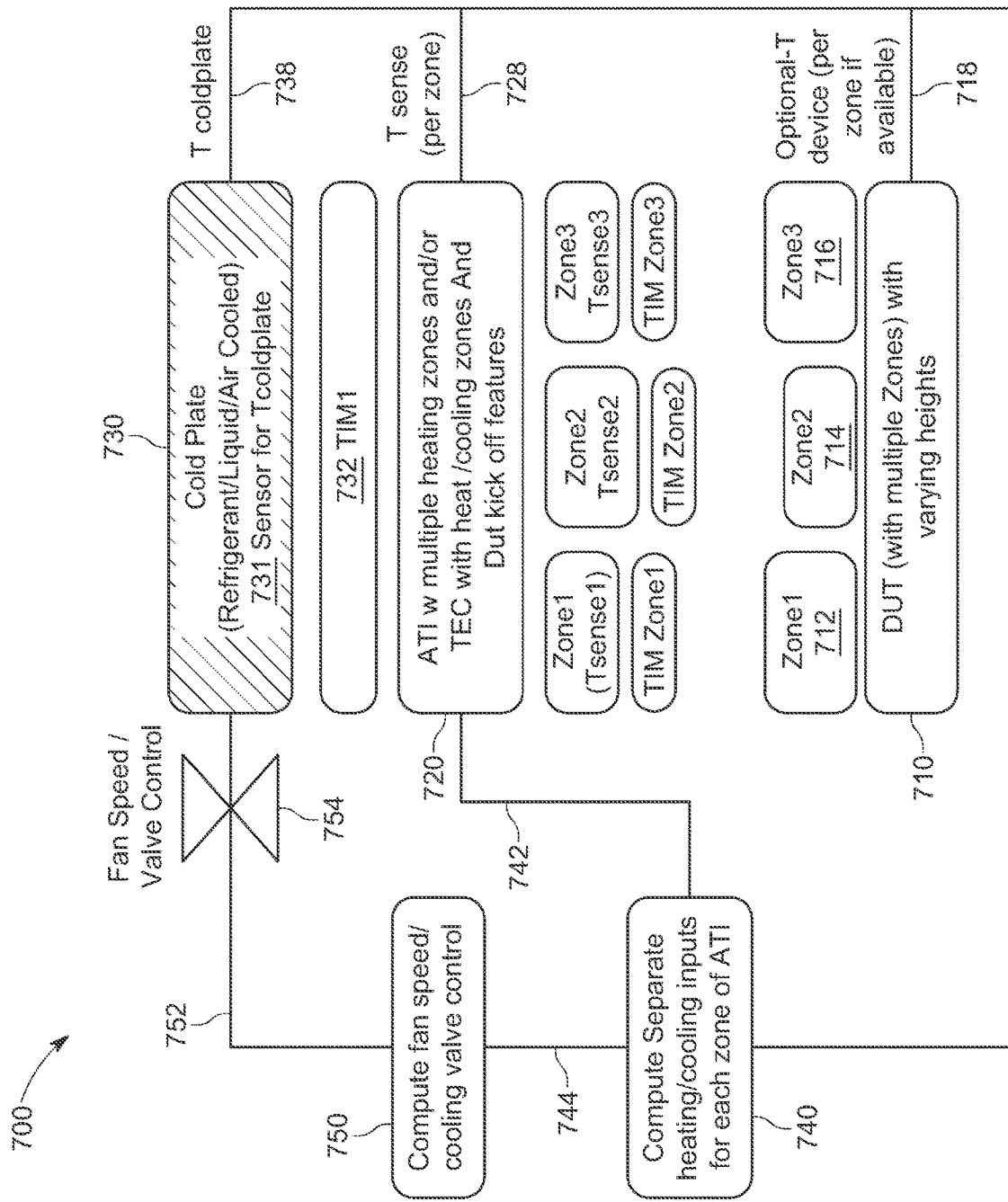
FIG. 7 is an exemplary block diagram of a control system for thermal control of a plurality of devices under test, in accordance with embodiments of the present invention.

FIG. 7 is an exemplary block diagram of a control system 700 for thermal control of a plurality of devices under test, in accordance with embodiments of the present invention. The control elements of control system 700, e.g., active thermal interposer device heating/cooling control 740 and/or cold plate control 750, may correspond to thermal controller 145 of FIG. 1A, in some embodiments. Device under test (DUT) 710 may have multiple zones of varying heights for temperature control, for example, zone 1 712, zone 2 714, and zone 3 715. An on-chip and/or in-package temperature measurement 718 is accessed, if available. In some embodiments, a temperature measurement from one or more temperature sensors on a load board may be accessed. It is desirable to access an on-chip, in-package, and/or load board temperature measurement corresponding to each zone. Any suitable on-chip, in-package, and/or load board temperature measurement device(s) may be utilized, e.g., a band gap, a ring oscillator, and/or a thermocouple.

Active thermal interposer device 720 is thermally coupled to device under test 710. Active thermal interposer device 720 comprises multiple heating and/or cooling zones to correspond to the multiple zones of device under test 710. In some embodiments, some heating and/or cooling zones of active thermal interposer device 720 may be mounted on buttons to account for different heights of the multiple zones of device under test 710, as previously described with respect to FIG. 4. A temperature measurement of cold plate 730 and one or more temperature measurements of each active thermal interposer device zone may be accessed at 738, 728, and/or 718.

Active thermal interposer device 720 is thermally coupled to a cold plate, e.g., cold plate 130 of FIG. 1A, e.g., via thermal interface material 732. A temperature measurement 738 of cold plate 730 made by cold plate temperature sensor 731 is accessed.

The several temperature measurements, e.g., 718, 728, 738 are inputs to active thermal interposer device heating/cooling control 740. Control 740 generates one or more control outputs for each zone of active thermal interposer device 720 to achieve a desired temperature for each of such zones. Control 740 also produces an output 744 that is input to cold plate control 750. Cold plate control 750 is configured to achieve a desired temperature of cold plate 730. Cold plate control 750 outputs a control signal 752 that controls operation of fan speed and/or coolant valve 754.

In accordance with embodiments of the present invention, one or both of active thermal interposer device heating/cooling control 740 and/or cold plate control 750 may utilize dual loop proportional-integral-derivative (PID) algorithms that are configured to utilize both heating and cooling elements to control a desired temperature for each zone of the device under test 710. For example, a first control loop may control a fan speed (for air control) and/or a fluid regulation valve (for liquid/refrigerant control) of the cold plate to control a temperature of the cold plate 730 as measured by cold plate temperature sensor 731. A second control loop may operate relatively faster than the first control loop to control temperatures of each zone of active thermal interposer device 720. As previously presented, each zone of active thermal interposer device 720 may comprise heating and cooling elements, in some embodiments.

Figure 8:
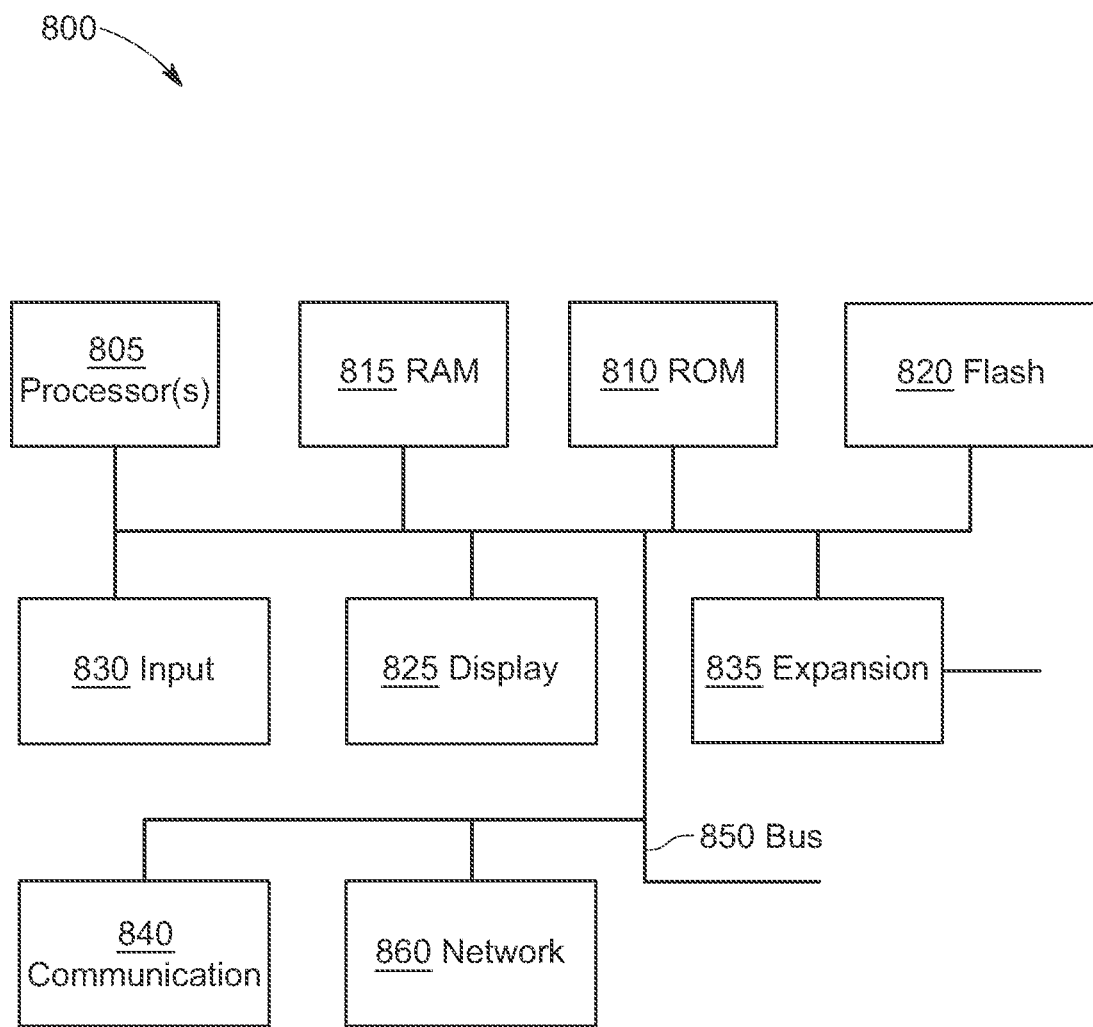
FIG. 8 illustrates a block diagram of an exemplary electronic system, which may be used as a platform to implement and/or as a control system for embodiments of the present invention.

FIG. 8 illustrates a block diagram of an exemplary electronic system 800, which may be used as a platform to implement and/or as a control system for embodiments of the present invention. Electronic system 800 may be a "server" computer system, in some embodiments. Electronic system 800 includes an address/data bus 850 for communicating information, a central processor complex 805 functionally coupled with the bus for processing information and instructions. Bus 850 may comprise, for example, a Peripheral Component Interconnect Express (PCIe) computer expansion bus, industry standard architecture (ISA), extended ISA (EISA), MicroChannel, Multibus, IEEE 796, IEEE 1196, IEEE 1496, PCI, Computer Automated Measurement and Control (CAMAC), MBus, Runway bus, Compute Express Link (CXL), and the like.

Central processor complex 805 may comprise a single processor or multiple processors, e.g., a multi-core processor, or multiple separate processors, in some embodiments. Central processor complex 805 may comprise various types of well known processors in any combination, including, for example, digital signal processors (DSP), graphics processors (GPU), complex instruction set (CISC) processors, reduced instruction set (RISC) processors, and/or very long word instruction set (VLIW) processors. Electronic system 800 may also includes a volatile memory 815 (e.g., random access memory RAM) coupled with the bus 850 for storing information and instructions for the central processor complex 805, and a non-volatile memory 810 (e.g., read only memory ROM) coupled with the bus 850 for storing static information and instructions for the processor complex 805. Electronic system 800 also optionally includes a changeable, non-volatile memory 820 (e.g., NOR flash) for storing information and instructions for the central processor complex 805 which can be updated after the manufacture of system 800. In some embodiments, only one of ROM 810 or Flash 820 may be present.

Also included in electronic system 800 of FIG. 8 is an optional input device 830. Device 830 can communicate information and command selections to the central processor 800. Input device 830 may be any suitable device for communicating information and/or commands to the electronic system 800. For example, input device 830 may take the form of a keyboard, buttons, a joystick, a track ball, an audio transducer, e.g., a microphone, a touch sensitive digitizer panel, eyeball scanner, and/or the like.

Electronic system 800 may comprise a display unit 825. Display unit 825 may comprise a liquid crystal display (LCD) device, cathode ray tube (CRT), field emission device (FED, also called flat panel CRT), light emitting diode (LED), plasma display device, electro-luminescent display, electronic paper, electronic ink (e-ink) or other display device suitable for creating graphic images and/or alphanumeric characters recognizable to the user. Display unit 825 may have an associated lighting device, in some embodiments.

Electronic system 800 also optionally includes an expansion interface 835 coupled with the bus 850. Expansion interface 835 can implement many well known standard expansion interfaces, including without limitation the Secure Digital Card interface, universal serial bus (USB) interface, Compact Flash, Personal Computer (PC) Card interface, CardBus, Peripheral Component Interconnect (PCI) interface, Peripheral Component Interconnect Express (PCI Express), mini-PCI interface, IEEE 8394, Small Computer System Interface (SCSI), Personal Computer Memory Card International Association (PCMCIA) interface, Industry Standard Architecture (ISA) interface, RS-232 interface, and/or the like. In some embodiments of the present invention, expansion interface 835 may comprise signals substantially compliant with the signals of bus 850.

A wide variety of well-known devices may be attached to electronic system 800 via the bus 850 and/or expansion interface 835. Examples of such devices include without limitation rotating magnetic memory devices, flash memory devices, digital cameras, wireless communication modules, digital audio players, and Global Positioning System (GPS) devices.

System 800 also optionally includes a communication port 840. Communication port 840 may be implemented as part of expansion interface 835. When implemented as a separate interface, communication port 840 may typically be used to exchange information with other devices via communication-oriented data transfer protocols. Examples of communication ports include without limitation RS-232 ports, universal asynchronous receiver transmitters (UARTs), USB ports, infrared light transceivers, ethernet ports, IEEE 8394, and synchronous ports.

System 800 optionally includes a network interface 860, which may implement a wired or wireless network interface. Electronic system 800 may comprise additional software and/or hardware features (not shown) in some embodiments.

Various modules of system 800 may access computer readable media, and the term is known or understood to include removable media, for example, Secure Digital ("SD") cards, CD and/or DVD ROMs, diskettes and the like, as well as non-removable or internal media, for example, hard drives, solid state drive s (SSD), RAM, ROM, flash, and the like.

Embodiments in accordance with the present invention provide systems and methods for active thermal interposer devices. In addition, embodiments in accordance with the present invention provide systems and methods for active thermal interposer devices operable to control different portions of a device under test to different temperatures. Further, embodiments in accordance with the present invention provide systems and methods for active thermal interposer devices operable to control different portions of a device under test at different heights to different temperatures. Still further, embodiments in accordance with the present invention provide systems and methods for active thermal interposer devices that are compatible and complementary with existing systems and methods of testing integrated circuits.

Although the invention has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

Various embodiments of the invention are thus described. While the present invention has been described in particular embodiments, it should be appreciated that the invention should not be construed as limited by such embodiments, but rather construed according to the below claims.

We claim:

1. A thermal interposer device for use in testing a device under test (DUT), said thermal interposer device comprising:
   a body layer comprising a first surface and a second surface, wherein said first surface is operable to be disposed adjacent to a cold plate; and
   a plurality of heating zones defined across said second surface of said body layer, said plurality of heating zones operable to selectively heat and maintain respective temperatures thereof, said plurality of heating zones operable to heat a respective plurality of areas of said DUT when, during testing, said second surface of said body layer is contemporaneously disposed adjacent to said DUT.

2. The thermal interposer device as described in claim 1, wherein the body layer in combination with the plurality of heating zones create a stand-alone device, and wherein the DUT is selected from a group including an integrated circuit device, a system in a package (SIP), and a multi-chip module (MCM).

3. The thermal interposer device as described in claim 1, wherein said plurality of heating zones is operable to be controlled by a thermal controller.

4. The thermal interposer device as described in claim 3 wherein each heating zone of said plurality of heating zones comprises resistive traces for providing heat responsive to a voltage/current signal applied thereto as controlled by said thermal controller.

5. The thermal interposer device as described in claim 4 wherein said body layer further comprises a plurality of pogo pin interfaces for mating with corresponding pogo pins of a thermal array, said plurality of pogo pin interfaces operable to input voltage/current signals from said thermal array for supply to said plurality of heating zones and also operable to output temperature sensor data corresponding to said plurality of heating zones.

6. The thermal interposer device as described in claim 4 further comprising a grounded shield layer disposed on top of said second surface of said body layer and disposed on top of said plurality of heating zones, said grounded shield layer operable to isolate said DUT from electro-magnetic interference radiation resultant from energizing heating zones of said plurality of heating zones.

7. The thermal interposer device as described in claim 1 wherein said body layer further comprises a two-dimensional identification code viewable thereon and wherein said two-dimensional identification code is operable to be machine read and provides one of:
   calibration values for a resistance temperature detector of the thermal interposer device;
   identification information for identifying the thermal interposer device; and
   security information for authenticating the thermal interposer device.

8. The thermal interposer device as described in claim 1 wherein said body layer further comprises alignment features disposed on said first surface, said alignment features for providing alignment between power pins of said thermal interposer device and pads of a thermal head of a tester system performing said testing, and wherein said thermal head comprises said cold plate.

9. The thermal interposer device as described in claim 8 wherein said alignment features comprise micro-alignment bushings.

10. The thermal interposer device as described in claim 1 further comprising a plurality of mechanical buttons for providing mechanical compliance between an interface surface of said DUT and said plurality of heating zones, wherein each mechanical button is disposed between said body layer and a respective heating zone of said plurality of heating zones, and wherein further each mechanical button comprises an array of spring loaded pogo pins.

11. The thermal interposer device as described in claim 1 further comprising a kick-off mechanical button disposed on said second surface of said body layer, said kick-off mechanical button comprising an array of spring loaded pogo pins and operable to separate an interface surface of said DUT from said second surface of said body layer when a force applied therebetween is removed.

12. The thermal interposer device as described in claim 1 wherein said DUT comprises a multi-chip module and wherein further said plurality of heating zones are operable to be selectively energized for selectively heating and maintaining temperatures of discrete chips of said multi-chip module during said testing of said DUT.

13. The thermal interposer device as described in claim 1 further comprising a Peltier/TEC cooling layer disposed on said first surface of said body layer.

14. The thermal interposer device as described in claim 13 wherein said body layer further comprises a plurality of pogo pin mechanical interfaces operable to input voltage/current signals for supply to said plurality of heating zones and also operable to output temperature sensor data corresponding to said plurality of heating zones and also operable to input signals to control said Peltier/TEC cooling layer.

15. The thermal interposer device as described in claim 3 wherein each heating zone of said plurality of heating zones comprises resistive traces for providing heat responsive to a voltage/current signal applied thereto as controlled by said thermal controller, wherein at least one or more of the resistive traces comprises different elements from a remainder of the resistive traces.

16. The thermal interposer device as described in claim 3 wherein each heating zone of said plurality of heating zones comprises resistive traces on a ceramic substrate for providing heat responsive to a voltage/current signal applied thereto as controlled by said thermal controller.

17. The thermal interposer device as described in claim 3 wherein each heating zone of said plurality of heating zones comprises resistive traces arranged in a serpentine pattern for providing heat responsive to a voltage/current signal applied thereto as controlled by said thermal controller.

18. The thermal interposer device as described in claim 1, wherein said active thermal interposer device comprises a base layer of aluminum nitride (AlN) with tungsten traces.

19. The thermal interposer device as described in claim 1, wherein said active thermal interposer device comprises a base layer of aluminum nitride (AlN) with molybdenum traces.

20. The thermal interposer device as described in claim 1, wherein said active thermal interposer device comprises a base layer of aluminum nitride (AlN) with molybdenum traces fabricated using a high temperature co-fired ceramic (HTCC) process, or wherein said active thermal interposer device comprises a base layer of aluminum nitride (AlN) with tungsten traces fabricated using a high temperature co-fired ceramic (HTCC) process.

21. The thermal interposer device as described in claim 1, wherein said active thermal interposer device comprises a base layer of aluminum nitride (AlN) with molybdenum traces fabricated using a low temperature co-fired ceramic (LTCC) process comprising aluminum oxide ($Al_2O_3$), or wherein said active thermal interposer device comprises a base layer of aluminum nitride (AlN) with tungsten traces fabricated using a low temperature co-fired ceramic (LTCC) process comprising aluminum oxide ($Al_2O_3$).

22. The thermal interposer device as described in claim 1 further comprising a plurality of mechanical buttons for providing mechanical compliance between an interface surface of said DUT and said plurality of heating zones, wherein said DUT is a multi-chip module (MCM), wherein each mechanical button is disposed between said body layer and a respective heating zone of said plurality of heating zones, and wherein further each mechanical button comprises an array of spring loaded pogo pins, and wherein each mechanical button corresponds to respective devices in the MCM and is operable to be raised to a different heights.

23. A method of testing a device under test (DUT) using an automated handler system and a tester system, said method comprising:
  using said handler, automatically picking up said DUT from a tray and automatically placing said DUT into a socket;
  using said handler, automatically picking up an active thermal interposer device and automatically placing said active thermal interposer device on top of said DUT within said socket wherein said automatically placing said active thermal interposer device comprises using alignment features of said active thermal interposer device and of said socket to align said active thermal interposer device; and
  using an optical sensor to determine if said active thermal interposer device is aligned planar regarding its orientation within said socket and with respect to said DUT.

24. A method as described in claim 23 further comprising:
  prior to said picking up the active thermal interposer device, using said optical sensor to determine if said DUT is aligned planar with respect to its orientation within said socket.

25. A method as described in claim 24 wherein said automatically picking up said DUT from a tray and automatically placing said DUT into a socket is performed by a first pick-and-place head of said handler and wherein further said automatically picking up an active thermal interposer device and automatically placing said active thermal interposer device onto top of said DUT within said socket is performed by a second pick-and-place head of said handler.

26. A method as described in claim 24 wherein said automatically picking up an active thermal interposer device and automatically placing said active thermal interposer device onto top of said DUT within said socket further comprises using an optical reader to scan a two dimensional identification code disposed on said active thermal interposer device wherein said two dimensional identification code provides information including one of: an identification of said active thermal interposer device; thermal calibration data regarding said active thermal interposer device; and authentication information regarding said active thermal interposer device and further comprising relaying said information to said tester system.

27. A method of testing a device under test (DUT) using an automated handler system and a tester system, said method comprising:
  using a first pick-and-place head of said handler system, automatically picking up said DUT from a tray and automatically placing said DUT into a socket; and
  using a second pick-and-place head of said handler system, automatically picking up an active thermal interposer device and automatically placing said active thermal interposer device onto top of said DUT within said socket, wherein said automatically placing said active thermal interposer device comprises aligning said active thermal interposer device using alignment features of said active thermal interposer device and of said socket.

28. A method as described in claim 27 wherein said automatically picking up an active thermal interposer device and automatically placing said active thermal interposer device onto top of said DUT within said socket further comprises using an optical reader to scan a two dimensional identification code disposed on said active thermal interposer device wherein said two dimensional identification code provides information including one of: an identification of said active thermal interposer device; thermal calibration data regarding said active thermal interposer device; and authentication information regarding said active thermal interposer device and further comprising relaying said information to said tester system.

29. A method of testing a device under test (DUT) using an automated handler system and a tester system, said method comprising:
  using said handler system, automatically picking up said DUT from a tray and automatically placing said DUT into a socket;
  using said handler system, automatically picking up an active thermal interposer device and automatically placing said active thermal interposer device on top of said DUT within said socket, wherein said automatically placing said active thermal interposer device comprises aligning said active thermal interposer device using alignment features of said active thermal interposer device and of said socket, wherein said active thermal interposer device, said DUT and said socket each have a respective two dimensional code disposed thereon for identification, authorization and/or calibration purposes; and
  using an optical reader to scan said two dimensional codes disposed on said active thermal interposer device, said DUT and said socket.

* * * * *